US012108685B2

(12) United States Patent
van der Straten et al.

(10) Patent No.: US 12,108,685 B2
(45) Date of Patent: Oct. 1, 2024

(54) MULTI-DIAMETER MAGNETIC RANDOM-ACCESS MEMORY PILLAR STRUCTURE

(71) Applicant: International Business Machines Corporation, Armonk, NY (US)

(72) Inventors: Oscar van der Straten, Guilderland Center, NY (US); Koichi Motoyama, Clifton Park, NY (US); Joseph F. Maniscalco, Lake Katrine, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 17/479,668

(22) Filed: Sep. 20, 2021

(65) Prior Publication Data
US 2023/0087231 A1    Mar. 23, 2023

(51) Int. Cl.
  *H10B 61/00*    (2023.01)
  *H10N 50/01*    (2023.01)
  *H10N 50/80*    (2023.01)

(52) U.S. Cl.
  CPC ............. *H10N 50/80* (2023.02); *H10B 61/00* (2023.02); *H10N 50/01* (2023.02)

(58) Field of Classification Search
  CPC ........ H10N 50/80; H10N 50/01; H10N 50/10; H10B 61/00
  See application file for complete search history.

(56) References Cited

U.S. PATENT DOCUMENTS

| 7,157,327 | B2 | 1/2007 | Haupt |
| 7,713,823 | B2 | 5/2010 | Sung et al. |
| 8,455,965 | B2 | 6/2013 | Li et al. |
| 8,644,063 | B2 | 2/2014 | Li et al. |
| 9,287,163 | B2 | 3/2016 | Kim |
| 10,186,597 | B2 | 1/2019 | Ahn et al. |
| 2015/0056722 | A1 | 2/2015 | Li et al. |
| 2018/0342669 | A1* | 11/2018 | Kim ...................... H10N 50/80 |
| 2020/0295085 | A1 | 9/2020 | Chen et al. |

FOREIGN PATENT DOCUMENTS

WO    2020061491 A1    3/2020

OTHER PUBLICATIONS

V. Y. Vassiliev, "ULSI Gap Filling with a Thin CVD SiO2-Based Insulator: A Review," Russian Microelectronics, vol. 31, No. 4, 2002, pp. 224-231.

* cited by examiner

*Primary Examiner* — Elias Ullah
(74) *Attorney, Agent, or Firm* — L. Jeffrey Kelly; Ryan Mason & Lewis LLP

(57) ABSTRACT

A semiconductor structure comprises a reference layer of a magnetic random-access memory pillar structure, the reference layer having a first diameter, a free layer of the magnetic random-access memory pillar structure disposed over the reference layer, the free layer having a second diameter, and an electrode layer of the magnetic random-access memory pillar structure disposed over the free layer, the electrode layer having a third diameter. At least two of the first diameter, the second diameter and the third diameter are different.

20 Claims, 29 Drawing Sheets

MULTI-DIAMETER MAGNETIC RANDOM-ACCESS MEMORY PILLAR STRUCTURE

BACKGROUND

The present application relates to semiconductors, and more specifically, to techniques for forming semiconductor structures. Magnetoresistive random access memory (MRAM) is a non-volatile computer memory (NVRAM) technology. In some conventional random access memory (RAM) devices, data is stored as electric charge or current flows. MRAM, in contrast, stores data using magnetic storage elements. Such elements may be formed using two ferromagnetic plates separated by a thin insulating later. Spin transfer torque MRAM (STT-MRAM) is a type of MRAM device in which the spin of electrons can be flipped using a spin-polarized current in a magnetic tunnel junction (MTJ).

SUMMARY

Embodiments of the invention provide techniques for forming multi-diameter magnetic random-access memory pillar structures.

In one embodiment, a semiconductor structure comprises a reference layer of a magnetic random-access memory pillar structure, the reference layer having a first diameter, a free layer of the magnetic random-access memory pillar structure disposed over the reference layer, the free layer having a second diameter, and an electrode layer of the magnetic random-access memory pillar structure disposed over the free layer, the electrode layer having a third diameter. At least two of the first diameter, the second diameter and the third diameter are different.

In another embodiment, an integrated circuit comprises one or more magnetic random-access memory devices. At least one of the one or more magnetic random-access memory devices comprises a magnetic random-access memory pillar comprising a reference layer having a first diameter, a free layer having a second diameter disposed over the reference layer, and an electrode layer having a third diameter disposed over the free layer. At least two of the first diameter, the second diameter and the third diameter are different.

In another embodiment, a method comprises forming a reference layer of a magnetic random-access memory pillar structure, the reference layer having a first diameter, forming a free layer of the magnetic random-access memory pillar structure over the reference layer, the free layer having a second diameter, and forming an electrode layer of the magnetic random-access memory pillar structure over the free layer, the electrode layer having a third diameter. At least two of the first diameter, the second diameter and the third diameter are different.

These and other features and advantages of embodiments described herein will become more apparent from the accompanying drawings and the following detailed description.

DETAILED DESCRIPTION

Illustrative embodiments of the invention may be described herein in the context of illustrative methods for forming multi-diameter magnetic random-access memory pillar structures, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Figure 26:
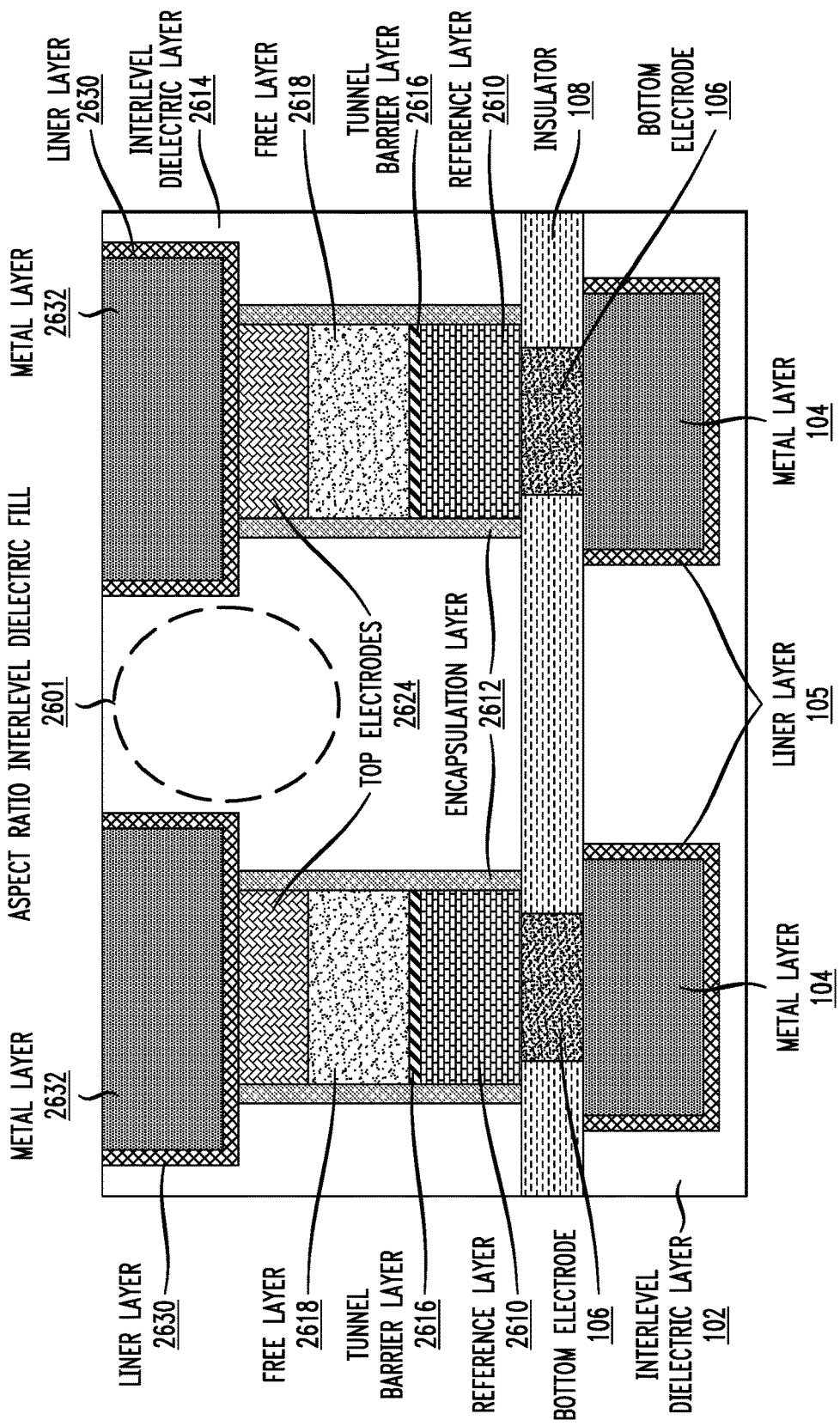
FIG. 26 depicts a semiconductor structure including an area with a risk of voids during ILD fill surrounding MRAM structures, according to an embodiment of the invention.
Figure 27:
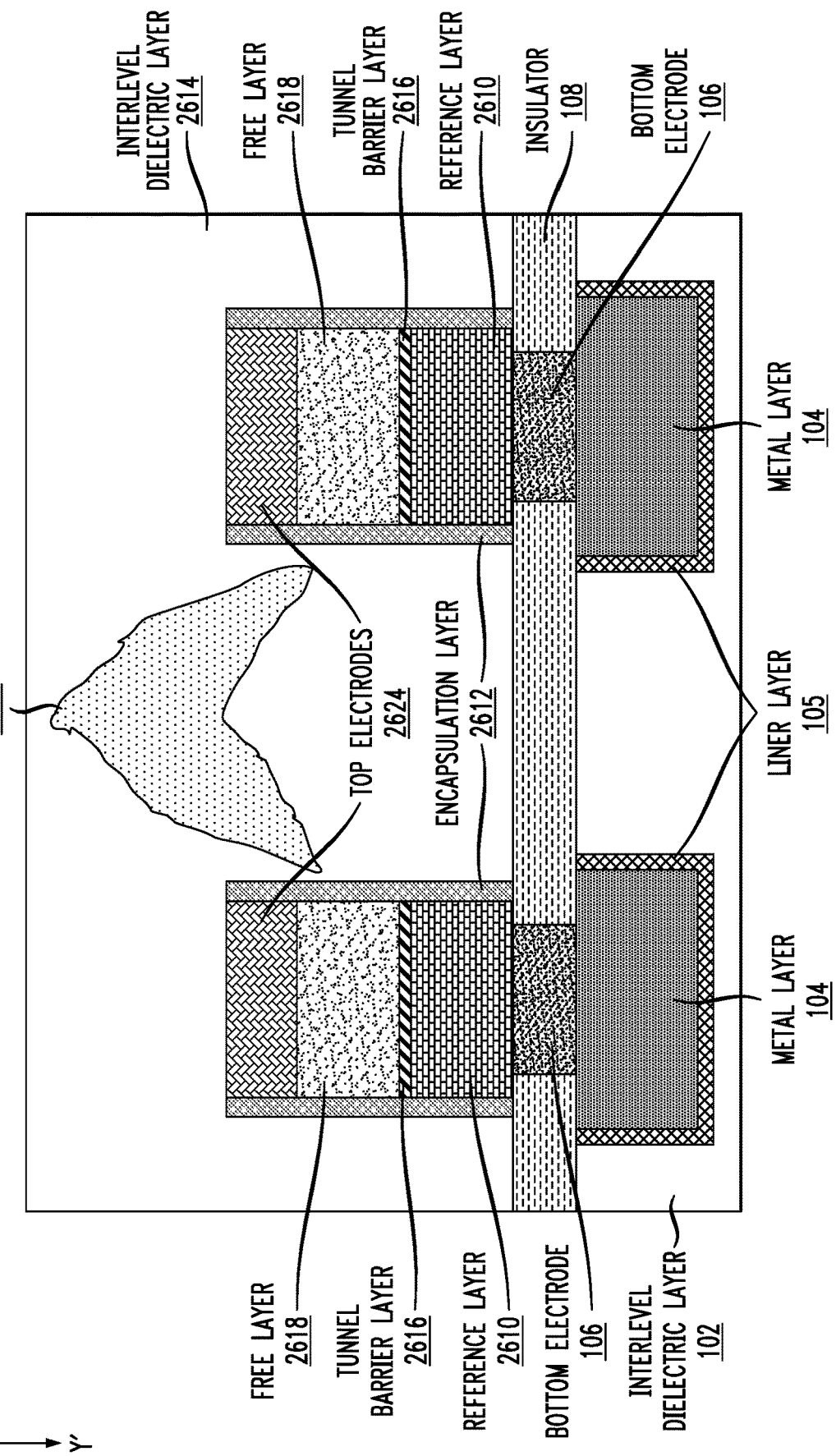
FIG. 27 depicts a semiconductor structure with a void formed during high aspect ratio ILD fill surrounding MRAM structures, according to an embodiment of the invention.
Figure 28:
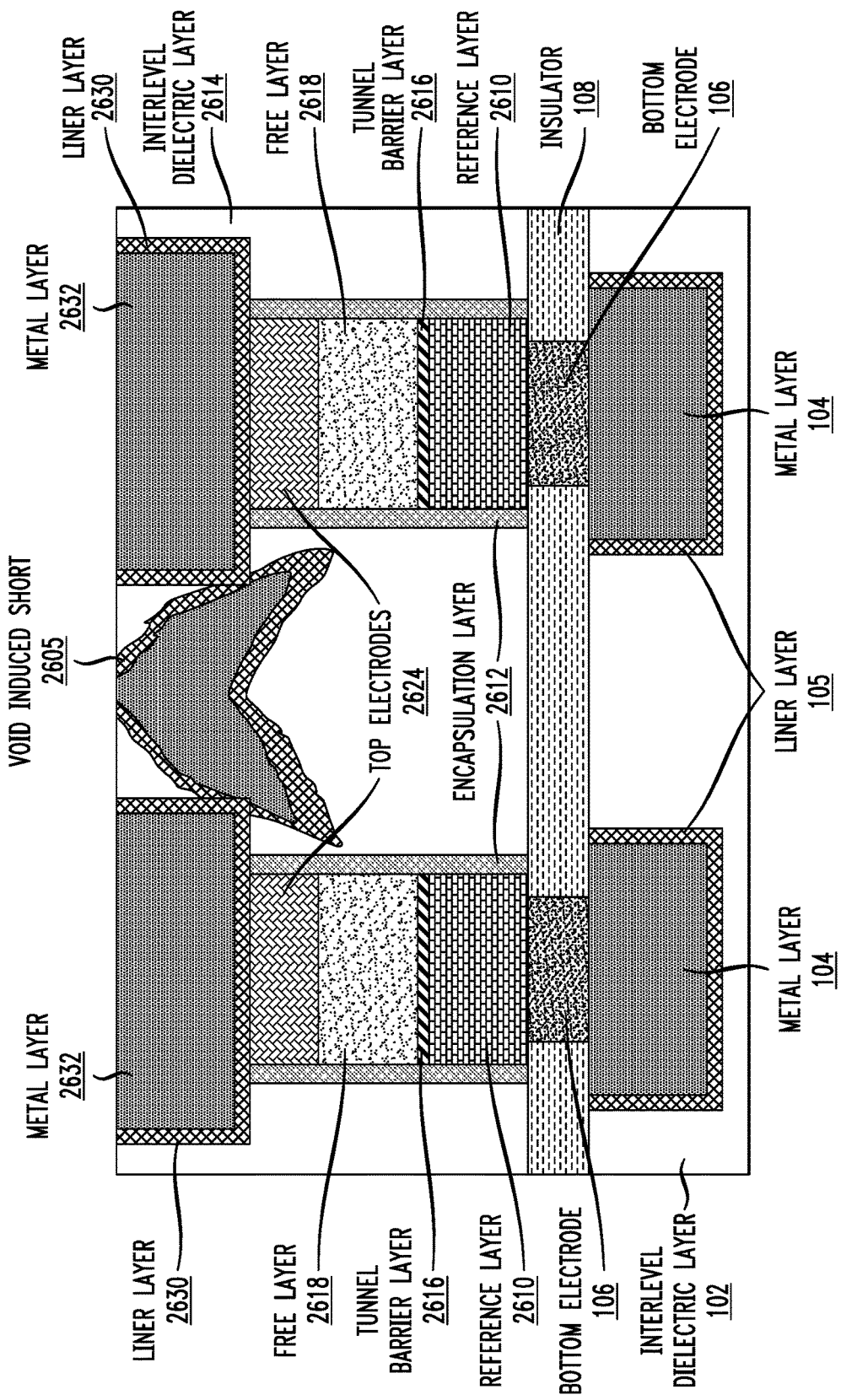
FIG. 28 depicts a void-induced short in the FIG. 27 semiconductor structure, according to an embodiment of the invention.

With continuous scaling, more and more devices (e.g., transistors, memory devices such as magnetic random-access memory (MRAM) devices, etc.) are packed into integrated circuit chips (e.g., into one or more 100 millimeter $(mm)^2$ chips). For high-performance MRAM devices which are based on perpendicular magnetic tunnel junction (MTJ) structures, well-defined interfaces and interface control are essential. An MTJ structure typically includes a cobalt (Co)-based synthetic anti-ferromagnet (SAF), a cobalt-iron-boron (CoFeB)-based reference layer, a magnesium oxide (MgO)-based tunnel barrier, a CoFeB-based free layer, and capping layers containing, for example, tantalum (Ta) and/or ruthenium (Ru). Embedded MTJ structures are usually formed by subtractive patterning of blanket MTJ stacks into pillars between two metal levels. After MTJ stack patterning, the inter-pillar spacers are filled with interlevel dielectric (ILD) to enable connection to back-end-of-line (BEOL) wiring by a top contact level. ILD gapfill between pillars, however, presents a significant challenge since the presence of voids in the ILD between the pillars can lead to shorts. This is illustrated in FIGS. 26-28, which will be described in further detail below. There is thus a need for embedded MTJ structures formed with a reduced risk of shorts induced by ILD voids.

Illustrative embodiments provide MRAM pillar structures having a multi-disc shape enabling void-free dielectric gap fill between the MRAM pillars. The multi-disc MRAM pillar structures advantageously have void-free ILD between pillars, since using the techniques described herein only low aspect ratio features need to be filled with ILD. In some embodiments, the MRAM pillar structure includes a reference layer (RL), a tunnel barrier (TB) and free layer (FL), and top electrode (TE) discs having different diameters D(k), where D(RL) has a smaller value than D(TB/FL), and D(TB/FL) has a smaller value than D(TE). In some embodiments, a same material (e.g., silicon nitride (SiN)) is used as a dielectric encapsulation material for both the reference layer and the free layer. In other embodiments, different materials (e.g., SiN and silicon carbonitride (SiCN)) are used as dielectric encapsulation materials for the reference layer and the free layer.

In some other embodiments (where either the same or different materials are used as dielectric encapsulation materials for the reference layer and the free layer), ILD nucleation layers are formed between ILD layers to enable good adhesion of ILD layers. The ILD nucleation layers may be formed coplanar with the top surface of the reference layer and/or the free layer. The ILD materials may be Si—(O,C) based dielectrics, such as: a dielectric including silicon, carbon, oxygen and hydrogen (SiCOH); a dielectric including silicon, carbon, nitrogen and oxygen (SiCNO); a dielectric including silicon, carbon, hydrogen, nitrogen and oxygen (SiCHNO); etc. The ILD nucleation layers may include silicon oxycarbide (SiOC), SiN, SiCN, etc. The ILD layers may be deposited using various techniques, including but not limited to spin-on deposition, chemical vapor deposition (CVD), plasma enhanced CVD (PECVD), etc.

Figure 1:
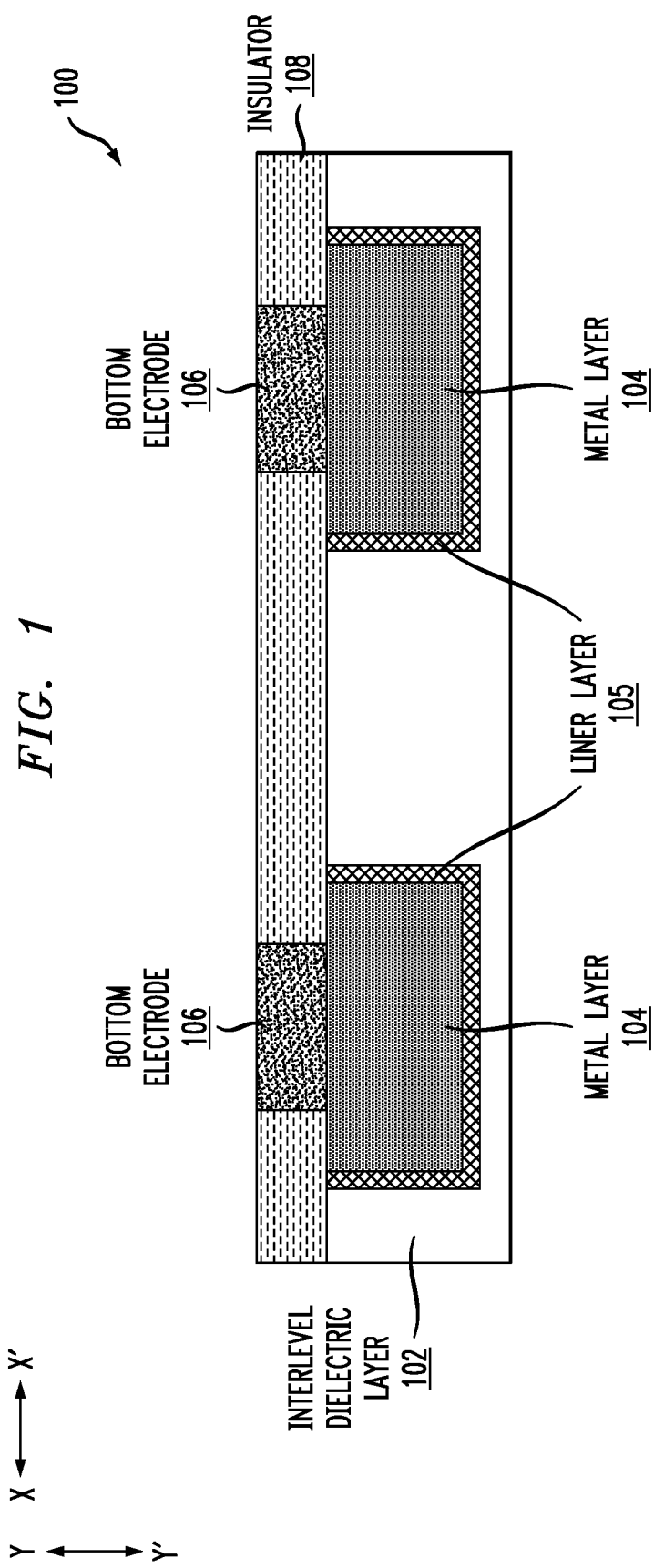
FIG. 1 depicts a side cross-sectional view of a semiconductor structure including bottom electrodes and bottom contacts for magnetic random-access memory (MRAM) structures, according to an embodiment of the invention.

FIG. 1 shows a side cross-sectional view 100 of a semiconductor structure, following bottom electrode formation for MRAM pillars. The structure includes an ILD layer 102, in which metal layer 104 and liner layers 105 are formed to provide contacts to bottom electrodes 106. The bottom electrodes 106 are surrounded by insulator layer 108.

The ILD layer 102 may be formed of various dielectric materials, including but not limited to Si—(O,C) based dielectrics, such as SiCOH, SiCNO, SiHCNO, etc. The ILD layer 102 may have a height or vertical thickness (in direction Y-Y') that fully encapsulates the metal layers 104 and liner layers 105.

The metal layers 104 may have respective widths or horizontal thickness (in direction X-X') in the range of 10 nanometers (nm) to 200 nm, and respective heights or vertical thickness (in direction Y-Y') in the range of 10 nm to 300 nm. The metal layers 104 may be formed of copper (Cu), tungsten (W), aluminum (Al), a copper-aluminum (CuAl) alloy, or other suitable material. The liner layers 105 may have a uniform thickness in the range of 2 nm to 20 nm. The liner layers 105 may be formed of tantalum (Ta), tantalum nitride (TaN), titanium (Ti), titanium nitride (TiN), bilayers of TaN/Ta or Ti/TiN, other multi-layers of Ta/TaN or Ti/TiN, or another suitable material.

The bottom electrodes 106 may have respective widths or horizontal thickness (in direction X-X') in the range of 8 nm to 180 nm, and respective heights or vertical thickness (in direction Y-Y') in the range of 2 nm to 200 nm. The bottom electrodes 106 may be formed of TaN, TiN, tungsten nitride (WN), ruthenium (Ru), molybdenum (Mo), or another suitable material. The insulator layer 108 may be formed such that its top surface is coplanar with top surfaces of the bottom electrodes 106. The insulator layer 108 surrounding the bottom electrodes 106 may be formed of SiN, SiNC or another suitable material.

Figure 2:
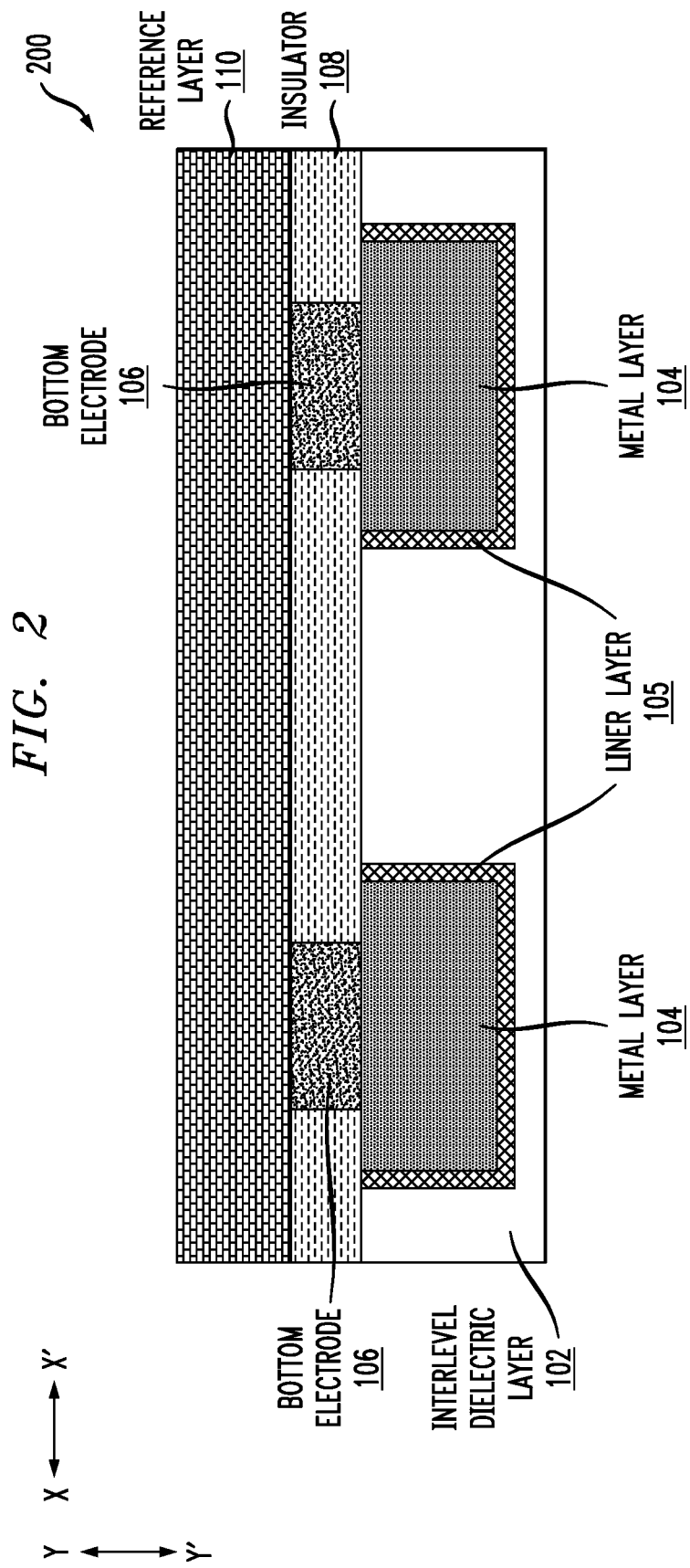
FIG. 2 depicts a side cross-sectional view of the FIG. 1 structure following formation of a reference layer for the MRAM structures, according to an embodiment of the invention.

FIG. 2 shows a side cross-sectional view 200 of the FIG. 1 structure, following formation of reference layer 110 over the bottom electrodes 106 and the insulator layer 108. The reference layer 110 may be formed using any suitable deposition technique. The reference layer 110 may comprise one or more magnetic layers, which may be Co-based. In some embodiments, the reference layer 110 is formed of a Co alloy, such as a cobalt-iron (CoFe), a cobalt-nickel (CoNi) or cobalt-boron (CoB) alloy. The reference layer 110 may have a height or vertical thickness (in direction Y-Y') in the range of 10 nm to 200 nm.

Figure 3:
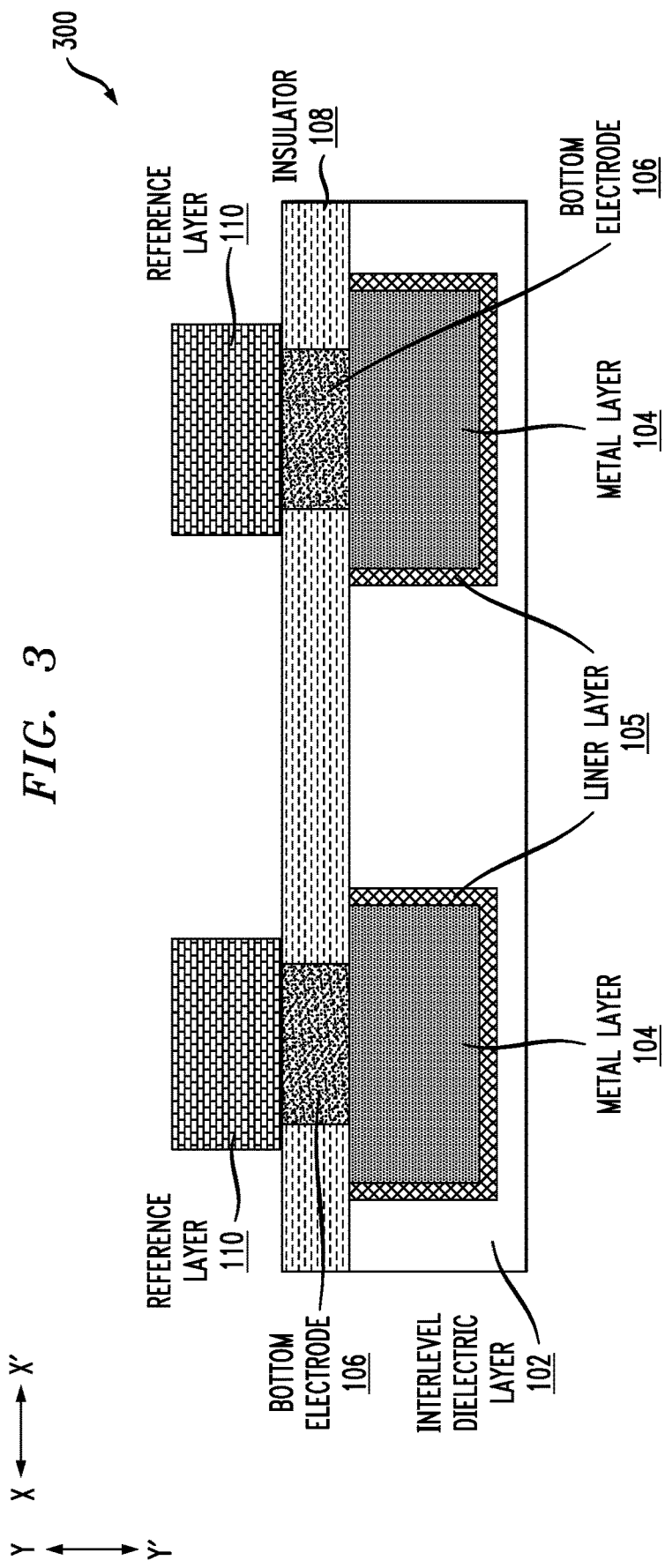
FIG. 3 depicts a side cross-sectional view of the FIG. 2 structure following patterning of the reference layer for the MRAM structures, according to an embodiment of the invention.

FIG. 3 shows a cross-sectional view 300 of the FIG. 2 structure, following patterning of the reference layer 110. The reference layer 110 may be patterned using various techniques, including through patterning a mask over portions of the reference layer 110 and etching exposed portions of the reference layer 110. Following patterning, there is a remaining portion of the reference layer 110 formed over each of the bottom electrodes 106. The remaining portions of the reference layer 110 are shown with a wider diameter (e.g., a width or horizontal thickness, in direction X-X') than the underlying bottom electrodes 106. For example, the diameter of the remaining portions of the reference layer 110 may be in the range of 10 nm to 200 nm.

Figure 4:
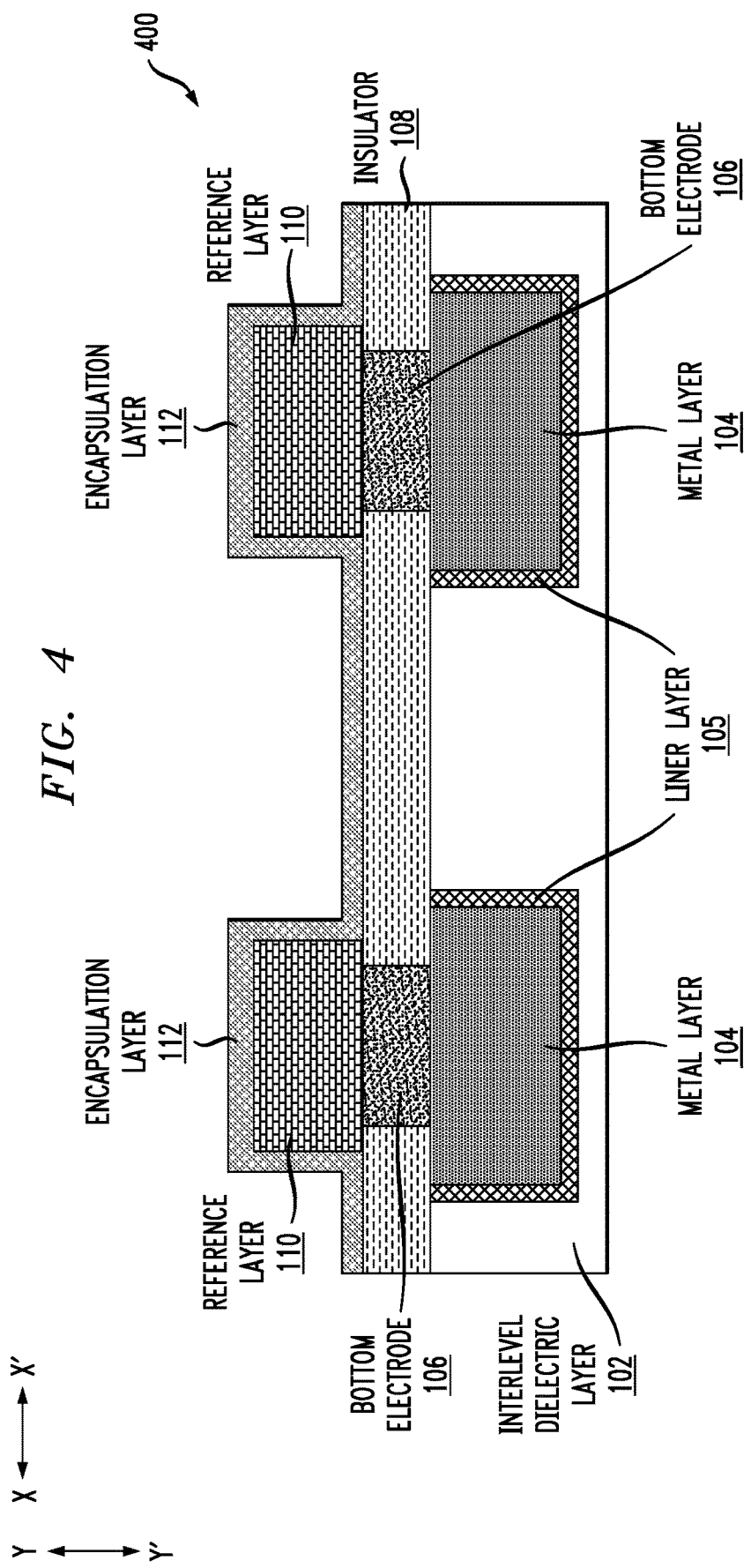
FIG. 4 depicts a side cross-sectional view of the FIG. 3 structure following formation of an encapsulation layer surrounding the reference layer, according to an embodiment of the invention.

FIG. 4 shows a cross-sectional view 400 of the FIG. 3 structure, following formation of an encapsulation layer 112 over the remaining portions of the reference layer 110 and the isolation layer 108. The encapsulation layer 112 may be formed using any suitable deposition technique, and may have a uniform thickness in the range of 2 nm to 25 nm. The encapsulation layer 112 may comprise a dielectric material, such as SiN, silicon nitride carbide (SiNC), etc.

Figure 5:
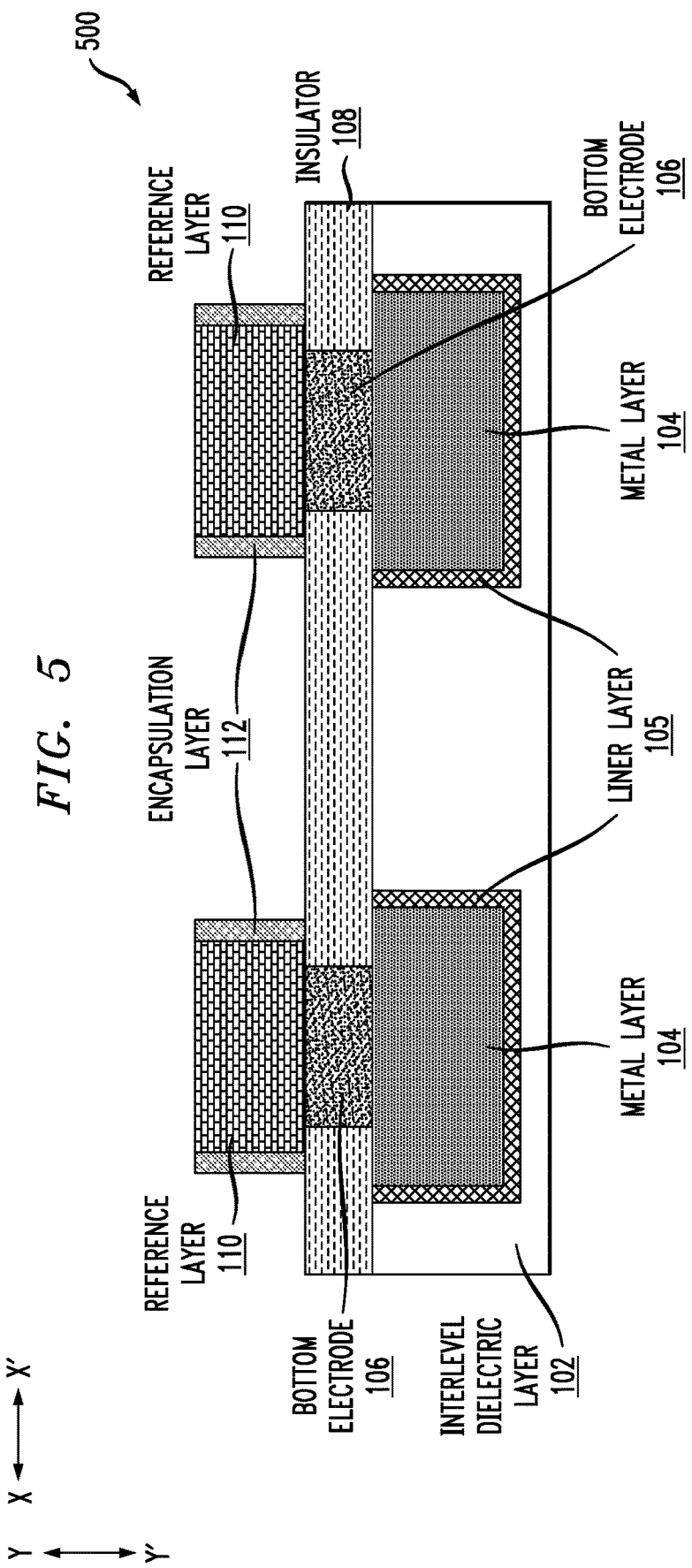
FIG. 5 depicts a side cross-sectional view of the FIG. 4 structure following etch-back of the encapsulation layer surrounding the reference layer, according to an embodiment of the invention.

FIG. 5 shows a cross-sectional view 500 of the FIG. 4 structure, following etch-back of the encapsulation layer 112. The encapsulation layer 112 may be etched back using reactive-ion etching (ME) or another suitable etch-back technique such as ion beam etching (IBE). The etch-back of the encapsulation layer 112 removes portions of the encapsulation layer 112 formed over a top surface of the remaining portions of the reference layer 110 and the insulator layer 108, such that the encapsulation layer 112 remains only on sidewalls of the remaining portions of the reference layer 110.

Figure 6:
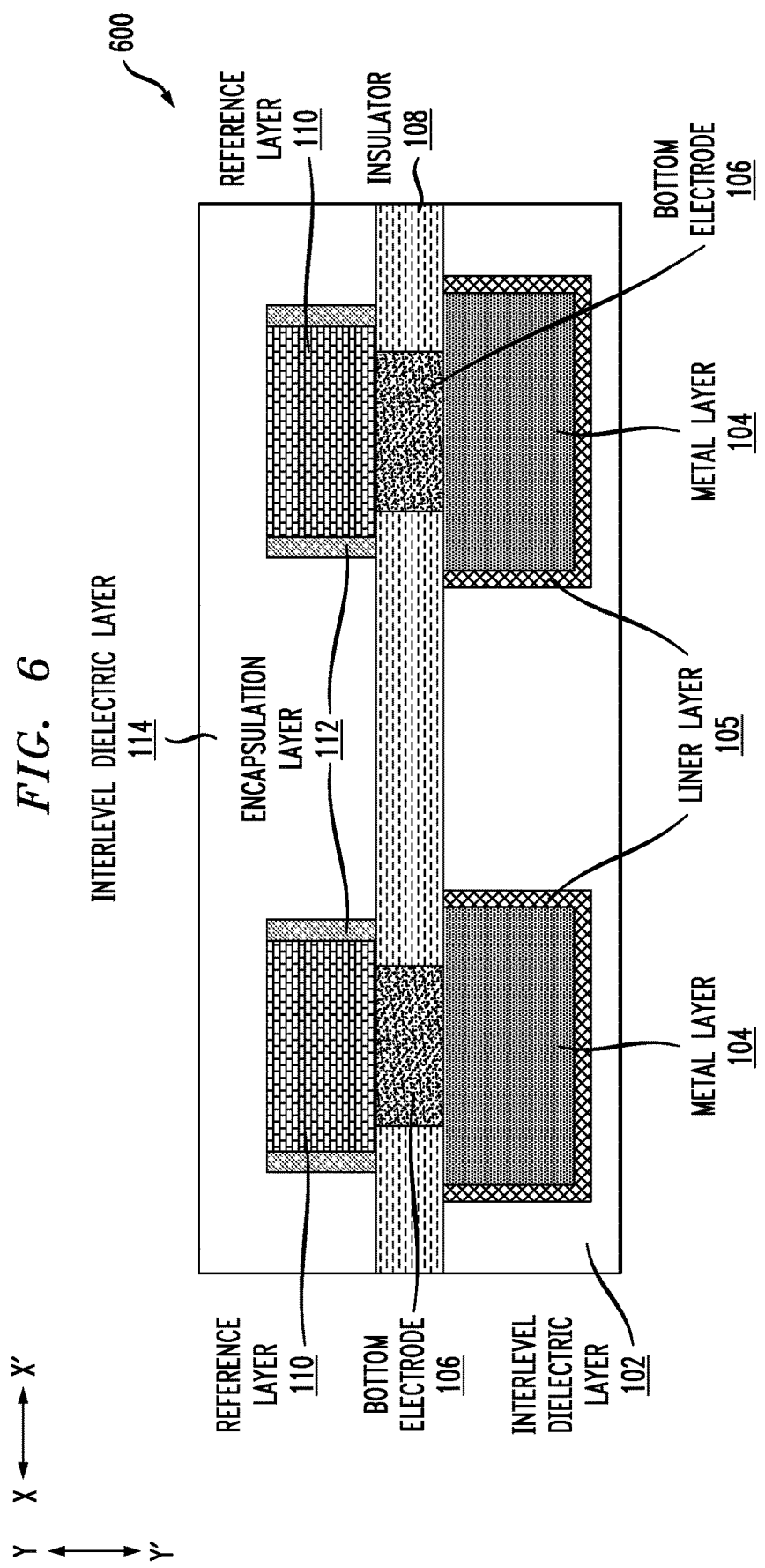
FIG. 6 depicts a side cross-sectional view of the FIG. 5 structure following formation of an interlevel dielectric (ILD) layer, according to an embodiment of the invention.

FIG. 6 shows a cross-sectional view 600 of the FIG. 5 structure, following formation of an ILD layer 114 that overfills the structure. The ILD layer 114 may be formed of materials similar to that described above with respect to ILD layer 102. The ILD layer 114 may have a height or vertical thickness (in direction Y-Y') that is greater than the height or vertical thickness of the remaining portions of the reference layer 110. Advantageously, the ILD layer 114 is formed in areas having a relatively "low" aspect ratio (e.g., between the remaining portions of the reference layer 110), such that there is a reduced concern of gaps or voids during fill of the material of the ILD layer 114.

Figure 7:
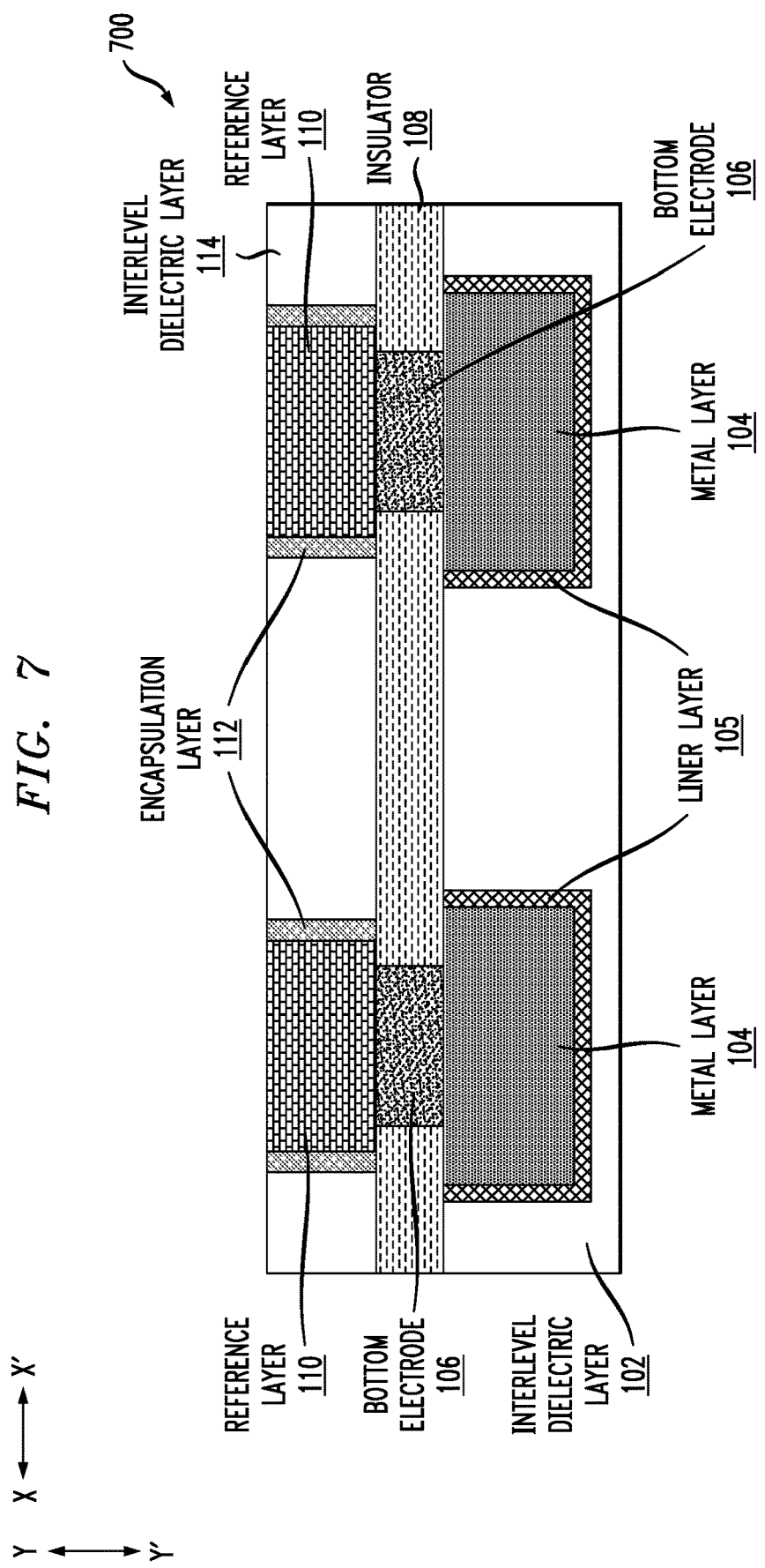
FIG. 7 depicts a side cross-sectional view of the FIG. 6 structure following overburden removal of the ILD layer, according to an embodiment of the invention.

FIG. 7 shows a cross-sectional view 700 of the FIG. 6 structure, following overburden removal of the ILD layer 114, such as using RIE or chemical mechanical planarization (CMP) processing, such that the remaining ILD layer 114 has a top surface that is coplanar with the top surface of the remaining portions of the reference layer 110 and encapsulation layer 112.

Figure 8:
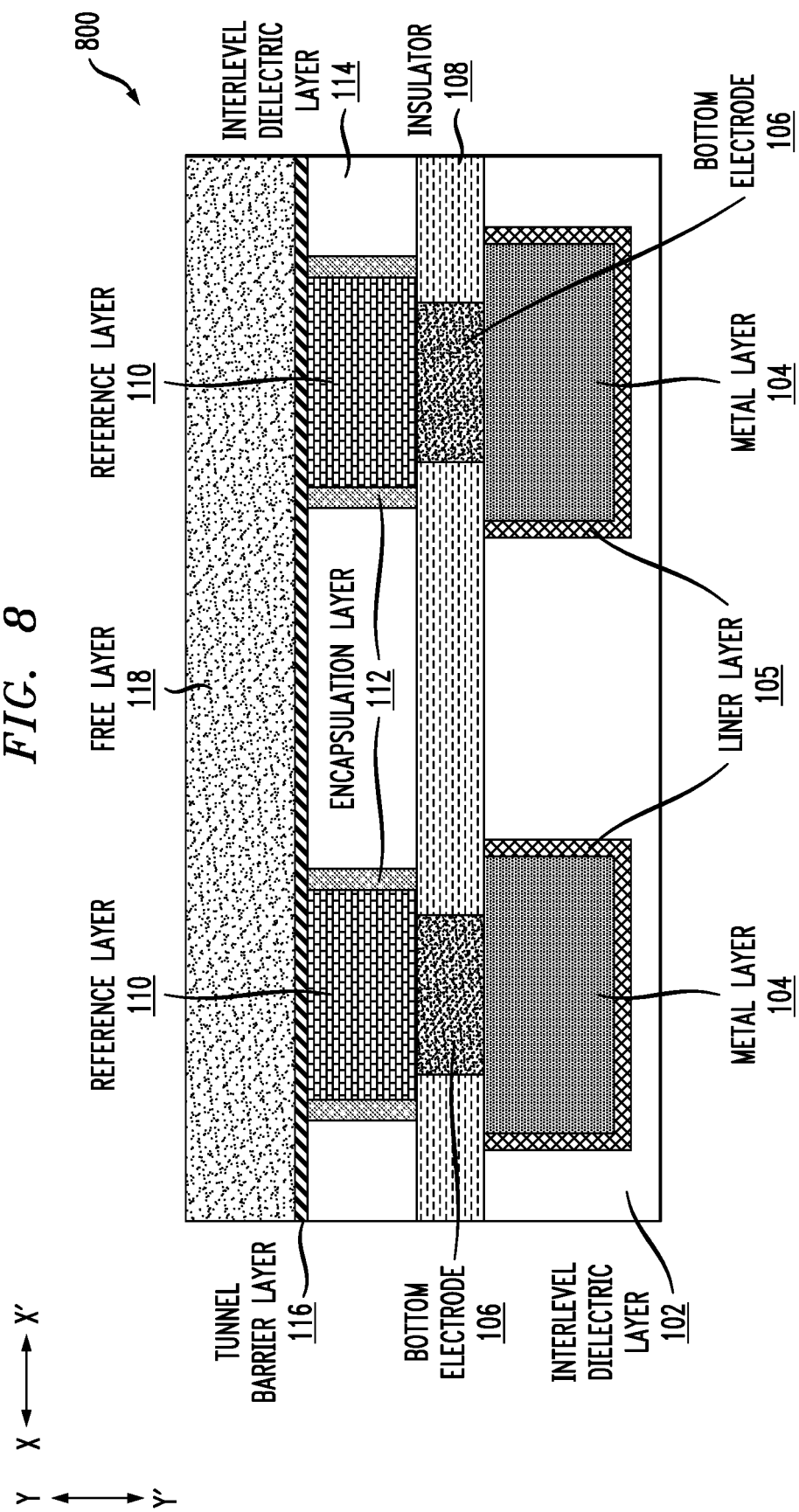
FIG. 8 depicts a side cross-sectional view of the FIG. 7 structure following formation of a tunnel barrier layer and a free layer for the MRAM structures, according to an embodiment of the invention.

FIG. 8 shows a cross-sectional view 800 of the FIG. 7 structure, following formation of a tunnel barrier layer 116 and a free layer 118. The tunnel barrier layer 116 and free layer 118 may be formed using any suitable deposition techniques. The tunnel barrier layer 116 may have a height or vertical thickness (in direction Y-Y') in the range of 0.5 nm to 1.5 nm, and the free layer 118 may have a height or vertical thickness (in direction Y-Y') in the range of 2 nm to 30 nm. The tunnel barrier layer 116 may be formed of MgO, or another suitable material such as aluminum oxide ($AlO_x$), magnesium titanium oxide (MgTiO), etc. The free layer 118 may be formed of a CoFeB alloy or other suitable material.

Figure 9:
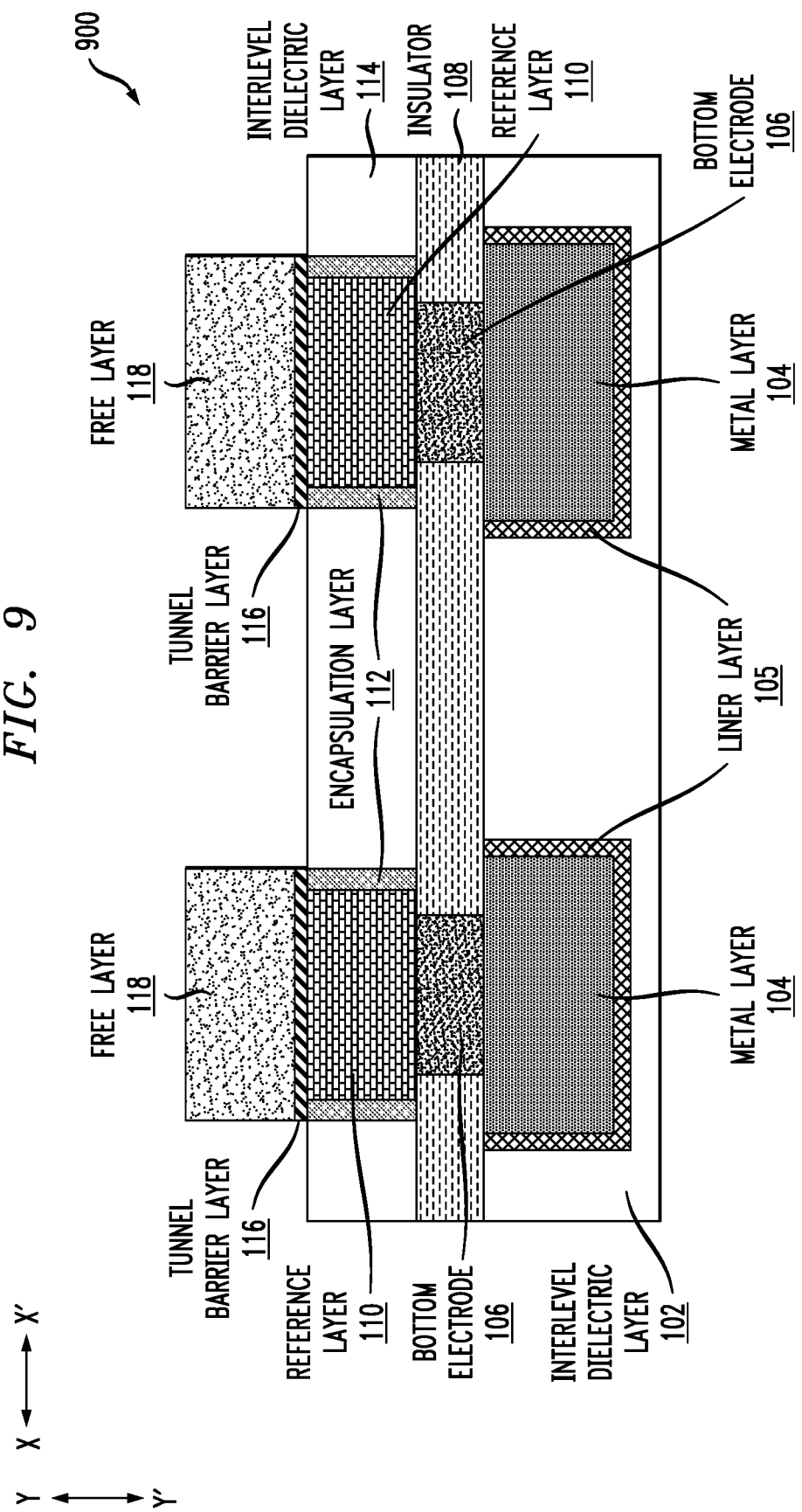
FIG. 9 depicts a side cross-sectional view of the FIG. 8 structure following patterning of the tunnel barrier layer and the free layer for the MRAM structures, according to an embodiment of the invention.

FIG. 9 shows a cross-sectional view 900 of the FIG. 8 structure, following patterning of the tunnel barrier layer 116 and free layer 118 over the remaining portions of the reference layer 110. The tunnel barrier layer 116 and the free layer 118 may be patterned using processing similar to that used for patterning of the reference layer 110. As shown in FIG. 9, the tunnel barrier layer 116 and the free layer 118 are patterned such that remaining portions thereof have diameters (e.g., widths or horizontal thicknesses in direction Y-Y') that are greater than the diameter of the underlying remaining portions of the reference layer 110. For example, each of the remaining portions of the tunnel barrier layer 116 and the free layer 118 may have a diameter in the range of 12 nm to 200 nm.

Figure 10:
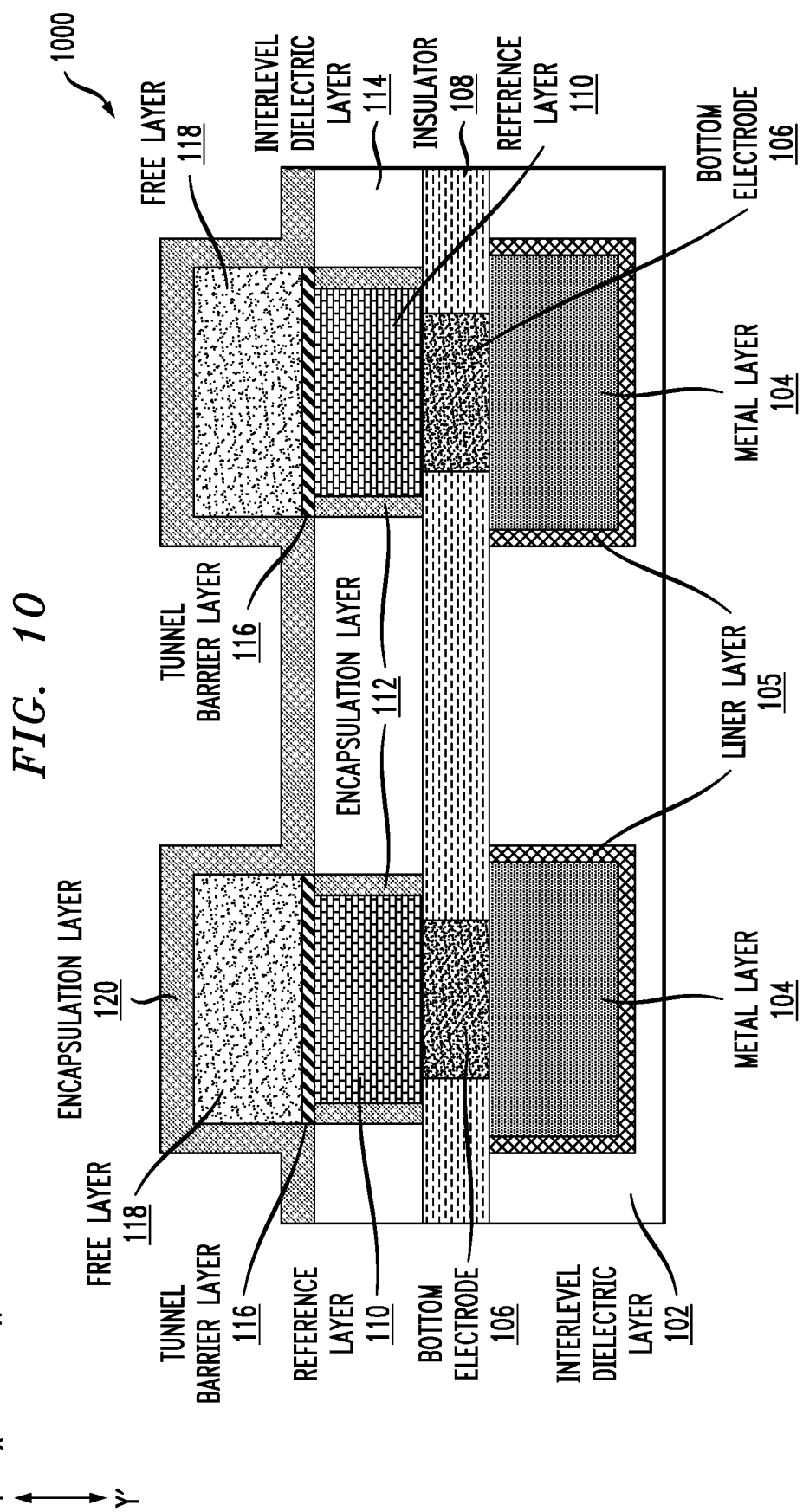
FIG. 10 depicts a side cross-sectional view of the FIG. 9 structure following formation of another encapsulation layer surrounding the tunnel barrier layer and the free layer, according to an embodiment of the invention.

FIG. 10 shows a cross-sectional view 1000 of the FIG. 9 structure, following formation of another encapsulation layer 120 surrounding the remaining portions of the tunnel barrier layer 116 and the free layer 118. The encapsulation layer 120 may be formed using processing similar to that described above with reference to formation of the encapsulation layer 112. The encapsulation layer 120 in this embodiment is illustratively formed of the same dielectric material as the encapsulation layer 112, and may have a uniform thickness that is also the same or similar to that of the encapsulation layer 112.

Figure 11:
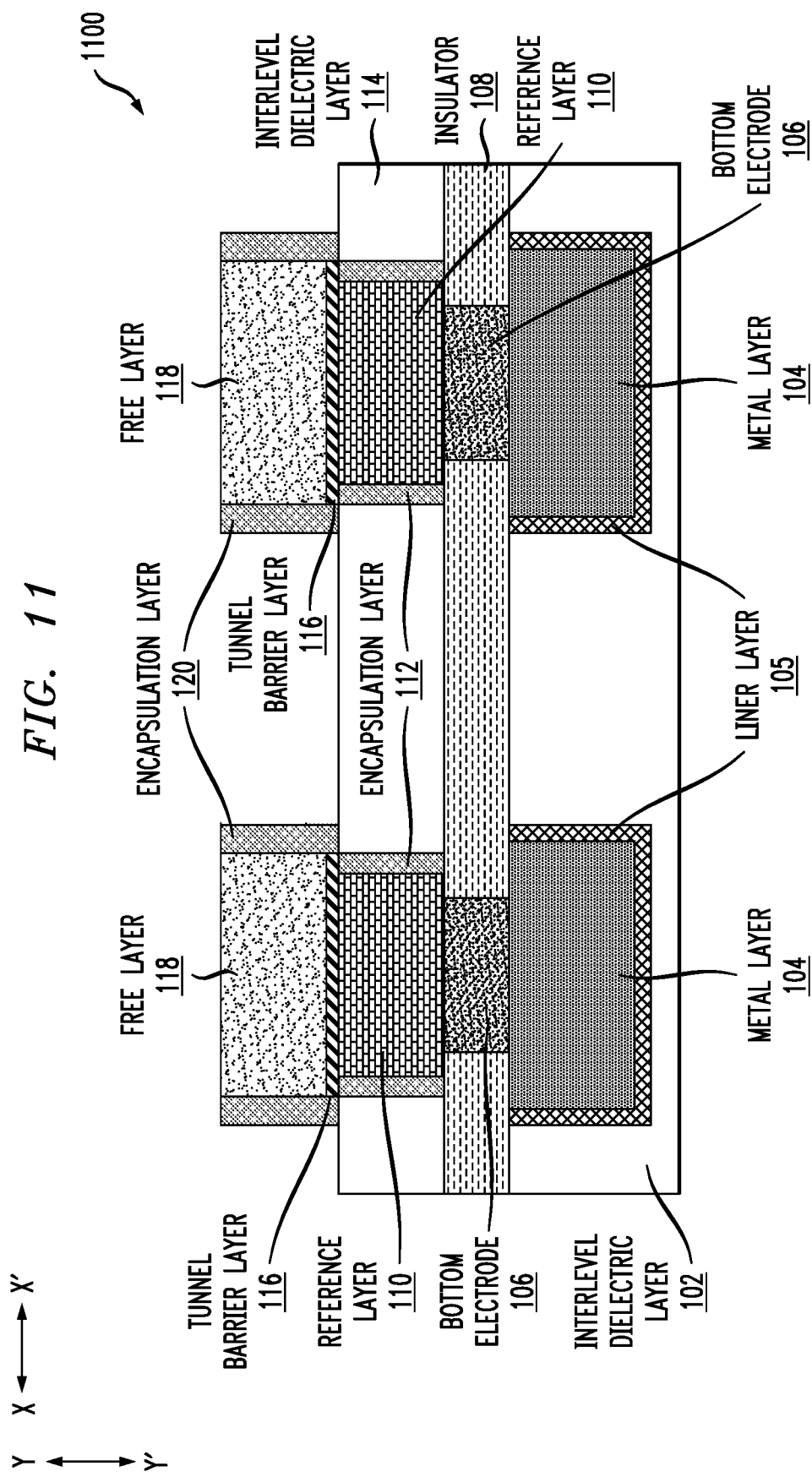
FIG. 11 depicts a side cross-sectional view of the FIG. 10 structure following etch-back of the encapsulation layer surrounding the tunnel barrier layer and the free layer, according to an embodiment of the invention.

FIG. 11 shows a cross-sectional view 1100 of the FIG. 10 structure, following etch-back of the encapsulation layer 120. The encapsulation layer 120 may be etched back using processing similar to that described above with respect to etch-back of the encapsulation layer 112. The etch-back of the encapsulation layer 120 removes portions of the encapsulation layer 120 formed over a top surface of the remaining portions of the free layer 118 and the ILD layer 114, such that the encapsulation layer 120 remains only on sidewalls of the remaining portions of the free layer 118 and the tunnel barrier layer 116.

Figure 12:
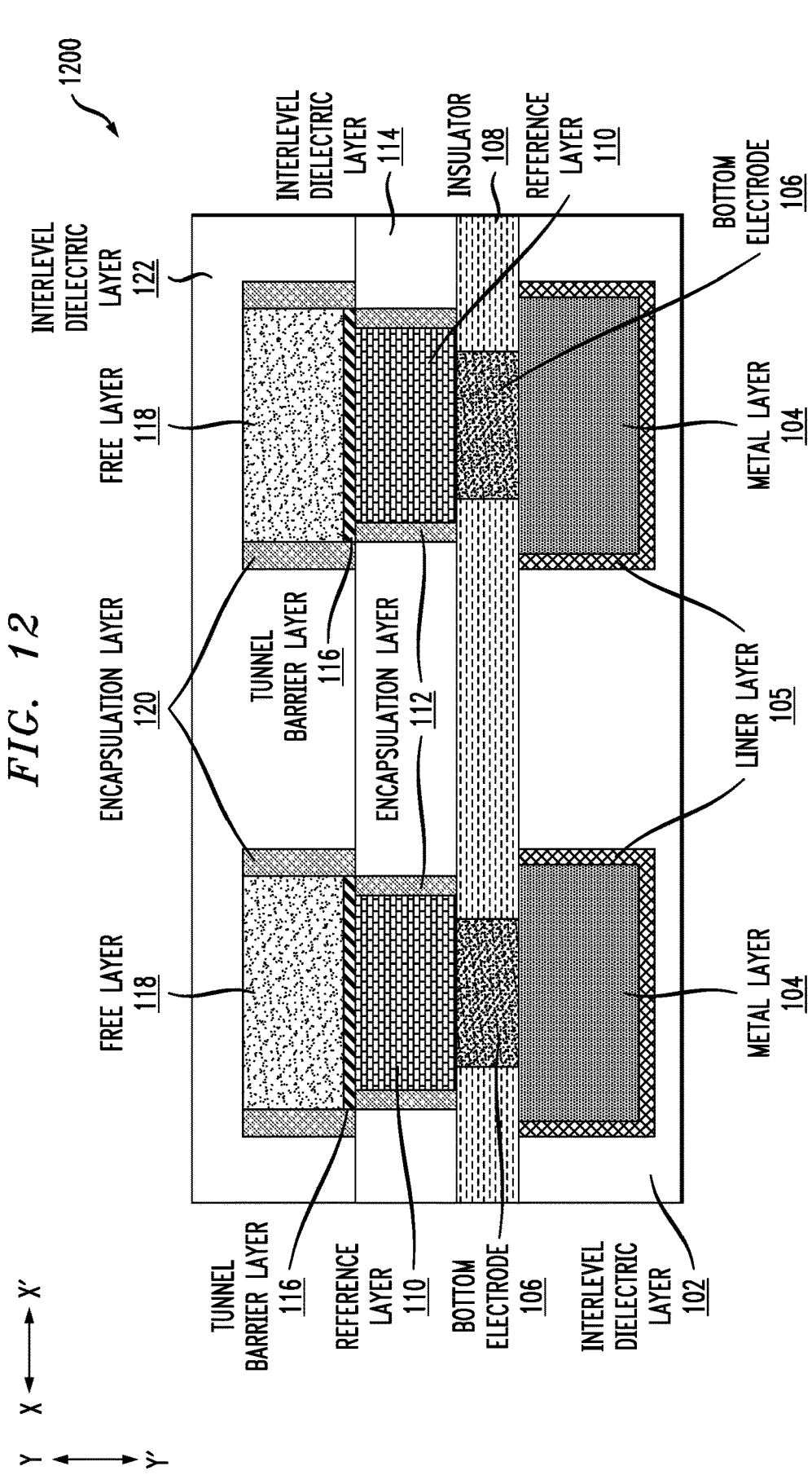
FIG. 12 depicts a side cross-sectional view of the FIG. 11 structure following formation of another ILD layer, according to an embodiment of the invention.

FIG. 12 shows a cross-sectional view 1200 of the FIG. 11 structure, following formation of an ILD layer 122 that overfills the structure. The ILD layer 122 may be formed of materials similar to that described above with respect to ILD layer 102. The ILD layer 122 may have a height or vertical thickness (in direction Y-Y') that is greater than the height or vertical thickness of the remaining portions of the free layer 118 and the tunnel barrier layer 116. Advantageously, the ILD layer 122 is formed in areas having a relatively "low" aspect ratio (e.g., between the remaining portions of the free layer 118 and the tunnel barrier layer 116), such that there is a reduced concern of gaps or voids during fill of the material of the ILD layer 122.

Figure 13:
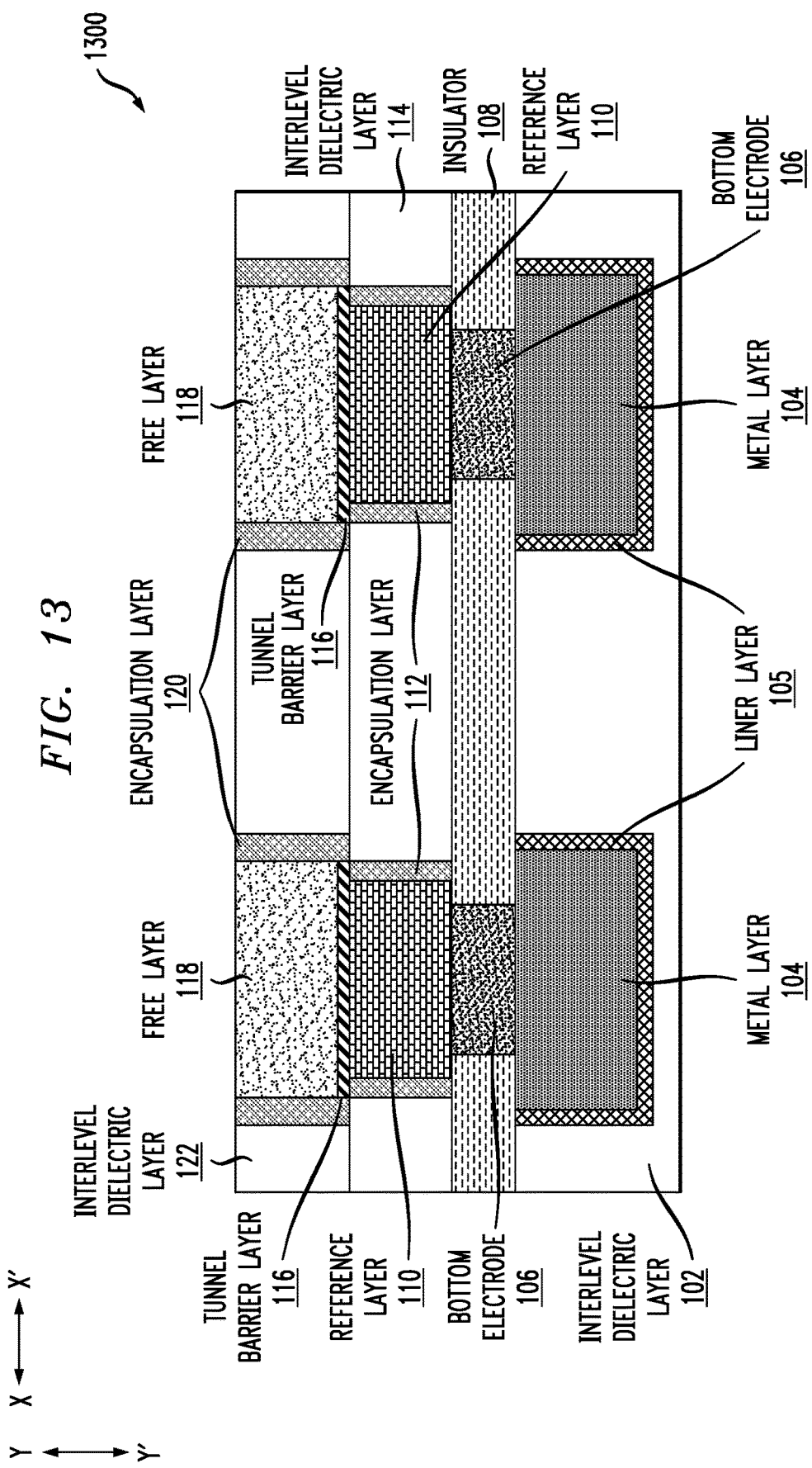
FIG. 13 depicts a side cross-sectional view of the FIG. 12 structure following overburden removal of the ILD layer, according to an embodiment of the invention.

FIG. 13 shows a cross-sectional view 1300 of the FIG. 12 structure, following overburden removal of the ILD layer 122, such as using RIE or CMP processing, such that the remaining ILD layer 122 has a top surface that is coplanar with the top surface of the remaining portions of the free layer 118 and encapsulation layer 120.

Figure 14:
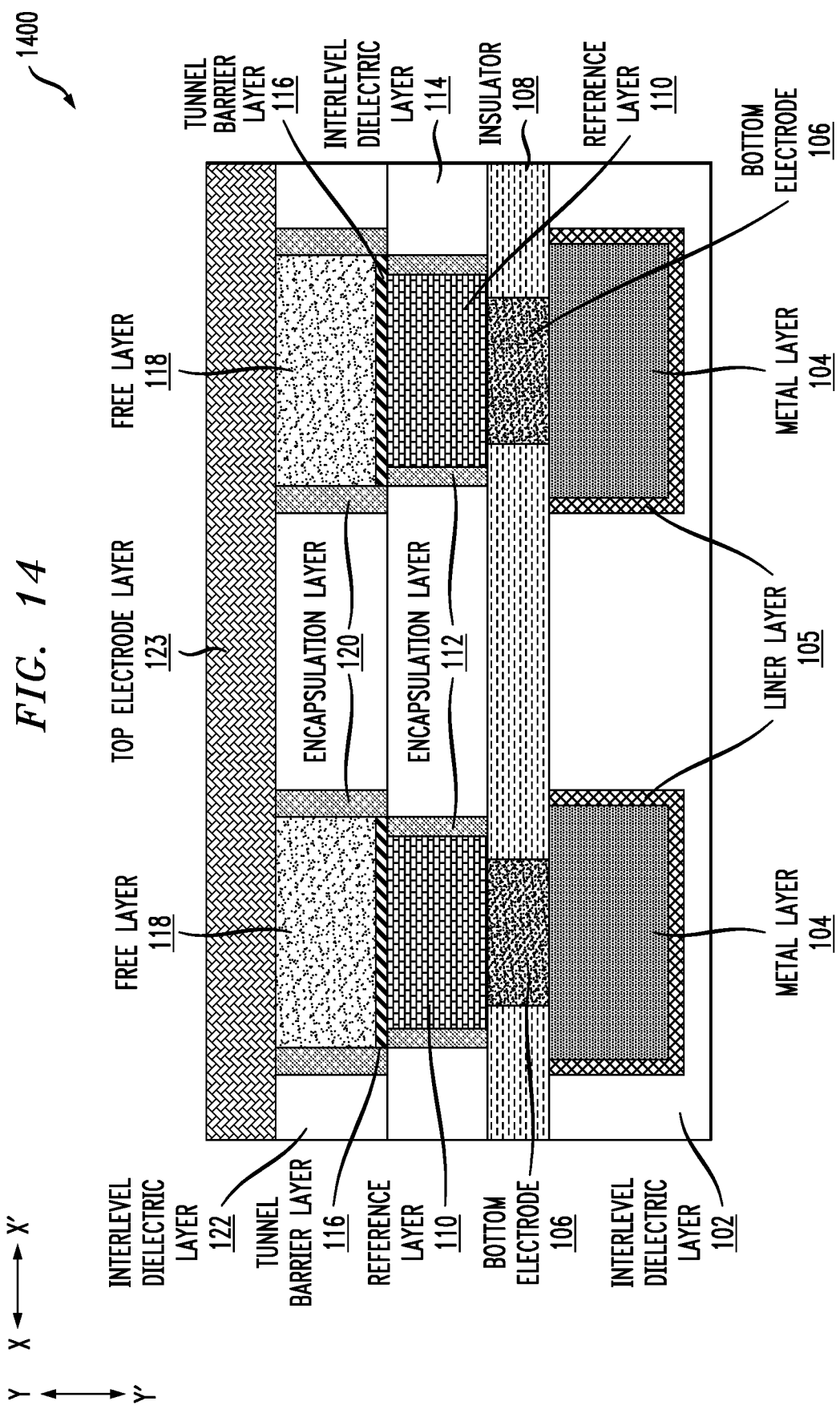
FIG. 14 depicts a side cross-sectional view of the FIG. 13 structure following formation of a top electrode layer for the MRAM structures, according to an embodiment of the invention.

FIG. 14 shows a cross-sectional view 1400 of the FIG. 13 structure, following formation of a top electrode layer 123 over the remaining portions of the free layer 118, the encapsulation layer 120 and the ILD layer 122. The top electrode layer 123 may be formed using any suitable deposition process, and may be formed of materials similar to those described above with respect to the bottom electrodes 106. The top electrode layer 123 may have a height or vertical thickness (in direction Y-Y') in the range of 10 nm to 100 nm.

Figure 15:
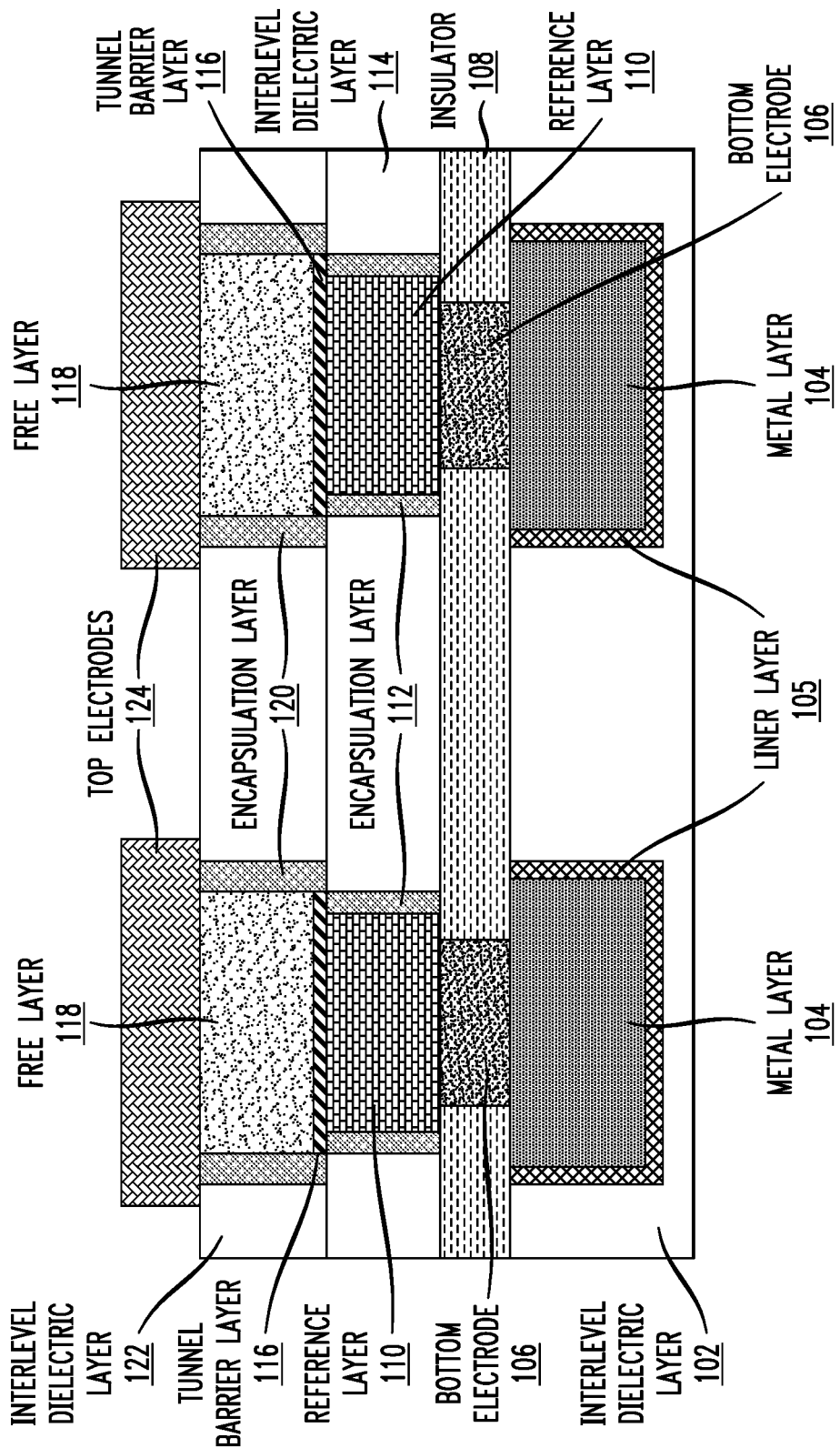
FIG. 15 depicts a side cross-sectional view of the FIG. 14 structure following patterning of the top electrode layer, according to an embodiment of the invention.

FIG. 15 shows a cross-sectional view 1500 of the FIG. 14 structure, following patterning of the top electrode layer 123 to form top electrodes 124 over each of the remaining portions of the free layer 118. The top electrode layer 123 may be patterned using any suitable processing, such as using lithographic processing. Following patterning, each of the top electrodes 124 has a diameter (e.g., a horizontal width or thickness in direction X-X') that is greater than a diameter of the underlying remaining portions of the free layer 118. The top electrodes 124 may have a diameter in the range of 14 nm to 200 nm.

Figure 16:
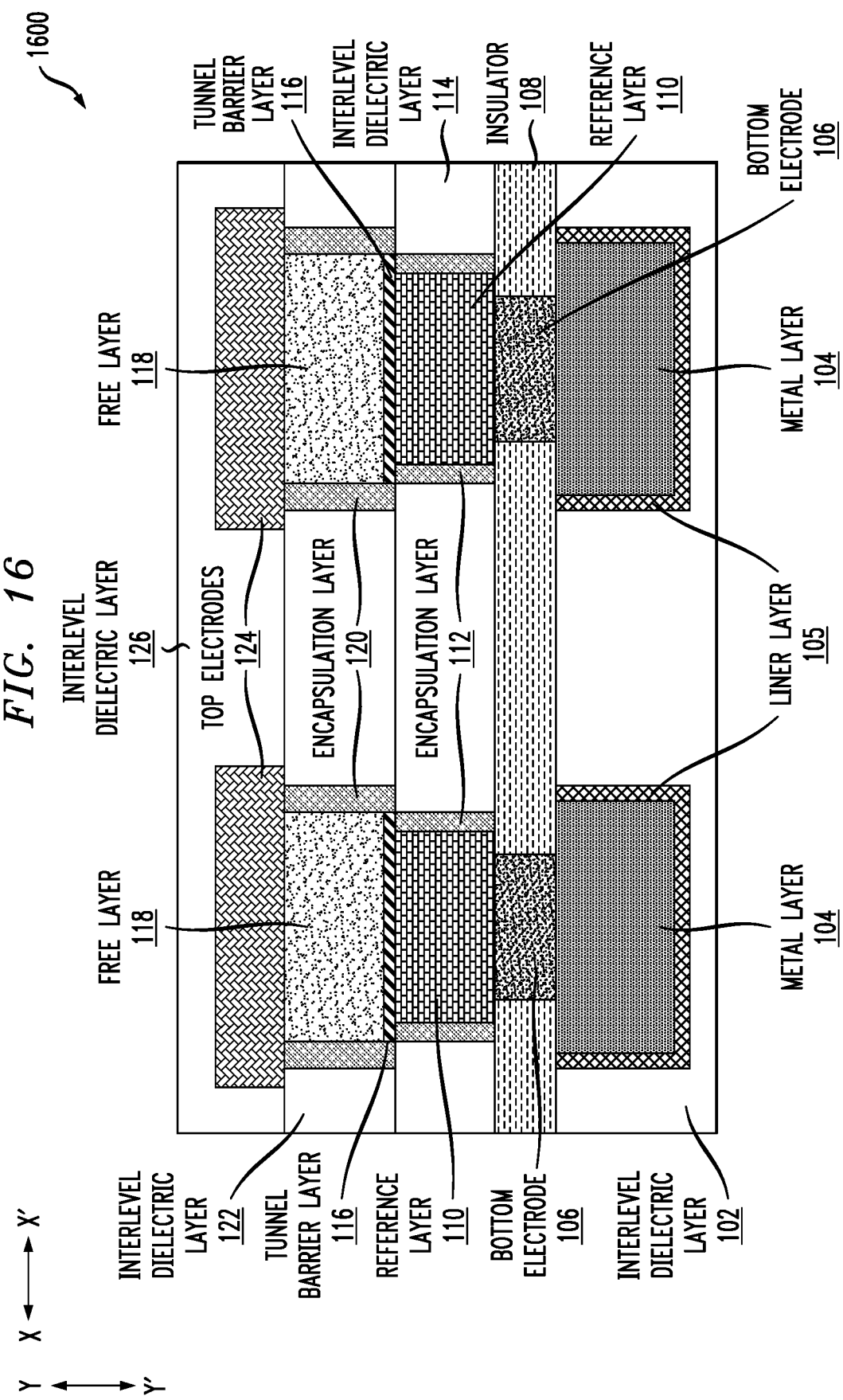
FIG. 16 depicts a side cross-sectional view of the FIG. 15 structure following formation of another ILD layer, according to an embodiment of the invention.

FIG. 16 shows a cross-sectional view 1600 of the FIG. 15 structure, following formation of an ILD layer 126 that overfills the structure. The ILD layer 126 may be formed of materials similar to that described above with respect to ILD layer 102. The ILD layer 126 may have a height or vertical thickness (in direction Y-Y') that is greater than the height or vertical thickness of the top electrodes 124. Advantageously, the ILD layer 124 is formed in areas having a relatively "low" aspect ratio (e.g., between top electrodes 124), such that there is a reduced concern of gaps or voids during fill of the material of the ILD layer 126.

Figure 17:
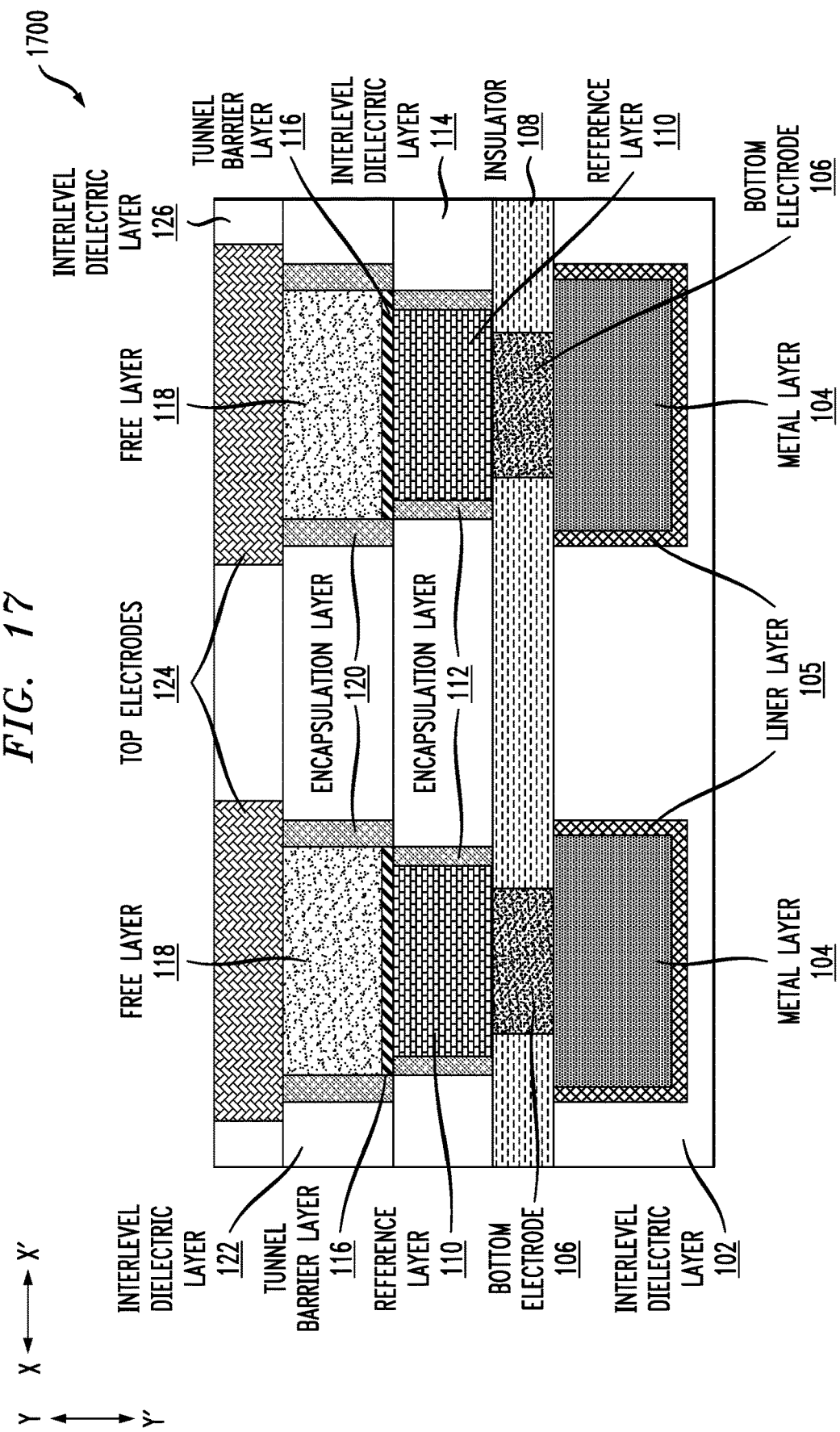
FIG. 17 depicts a side cross-sectional view of the FIG. 16 structure following overburden removal of the ILD layer, according to an embodiment of the invention.

FIG. 17 shows a cross-sectional view 1700 of the FIG. 16 structure, following overburden removal of the ILD layer 126, such as using RIE or CMP processing, such that the remaining ILD layer 126 has a top surface that is coplanar with the top surface of the top electrodes 124.

As illustrated in FIGS. 1-17, the regions between MRAM pillars (e.g., including bottom electrodes 106, reference layer 110, tunnel barrier layer 116, free layer 118, and top electrodes 124) are formed using multiple ILD formation steps. More specifically, three ILD formation steps are utilized (e.g., a first for formation of ILD layer 114 surrounding the reference layer 110, a second for formation of the ILD layer 122 surrounding the tunnel barrier layer 116 and the free layer 118, and a third for formation of ILD layer 126 surrounding the top electrodes 124). Each of the ILD formation steps involves a relatively "low" aspect ratio fill, such that there is a reduced risk of voids in the ILD layers 114, 122 and 126. This is compared with a relatively "high" aspect ratio ILD fill that would be required if the entire MRAM pillars, or at least more of the layers of the MRAM pillars, were formed and patterned together. For example, a conventional approach may form and pattern the reference layer, tunnel barrier layer, free layer and top electrode of MRAM pillars together, and then fill an ILD between the pillars. Such processing, however, involves a relatively high aspect ratio ILD fill (due to the combined thicknesses of the reference layer, the tunnel barrier layer, the free layer and the top electrode) where there is a risk of voids in the ILD that can lead to shorts.

Using the processing shown and described with respect to FIGS. 1-17, different layers of the MRAM pillars have different diameters (e.g., the diameter of the top electrodes 124 is greater than the diameter of the tunnel barrier layer 116 and the free layer 118, and the diameter of the tunnel barrier layer 116 and the free layer 118 is greater than the diameter of the reference layer 110). It should be appreciated, however, that if fewer than three separate ILD formation steps were utilized then there may be fewer than three different diameters for the layers or discs of the MRAM pillars. Consider, as an example, formation and patterning of the top electrodes 124 at the same time as the tunnel barrier layer 116 and the free layer 118 (e.g., in a case where the combined heights or vertical thicknesses in direction Y-Y' of such layers does not lead to an undesirable high aspect ratio ILD fill), where the top electrodes 124, the tunnel barrier layer 116 and the free layer 118 would have the same diameter, which is greater than the diameter of the reference layer 110. Various other combinations are possible.

Figure 18:
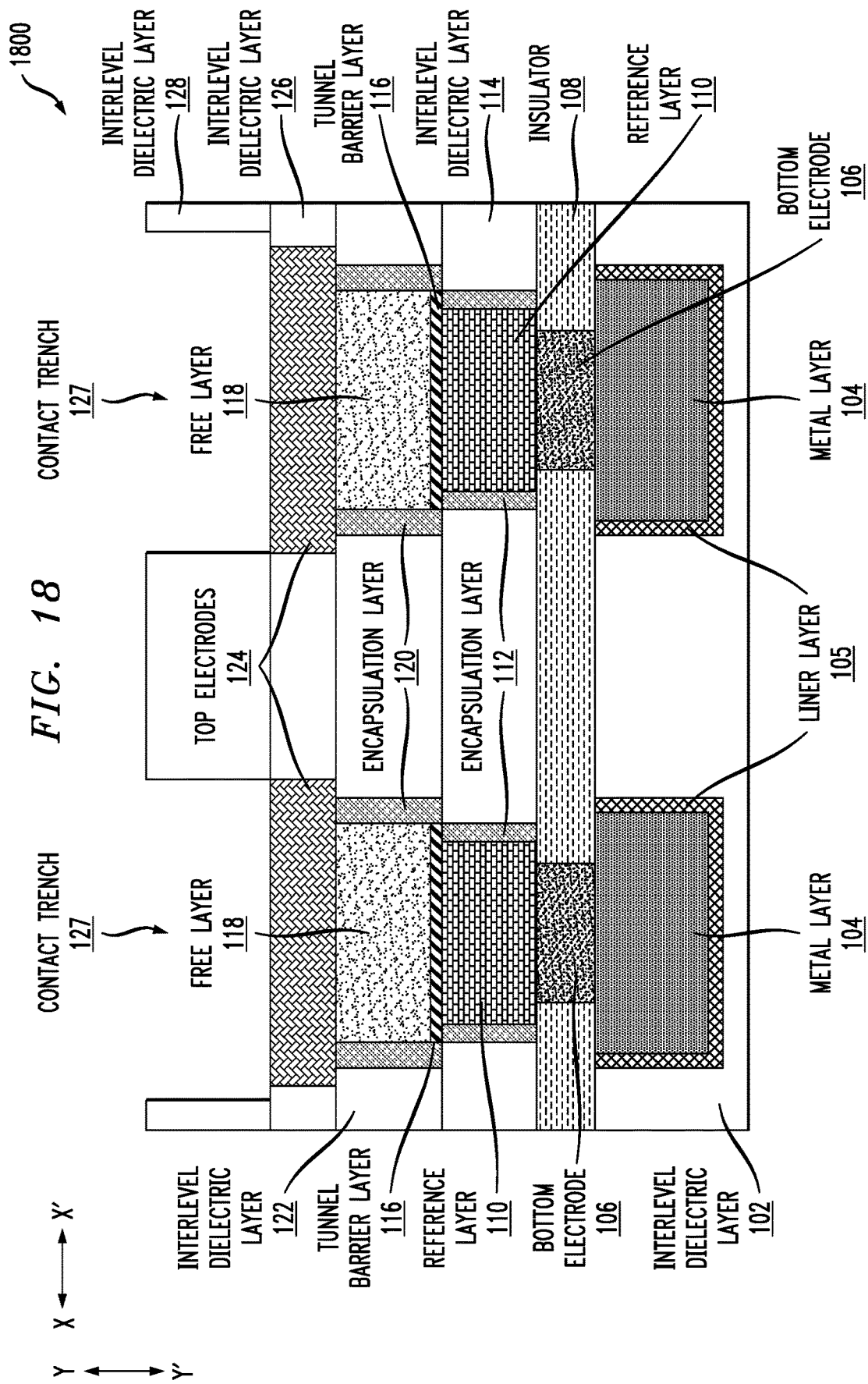
FIG. 18 depicts a side cross-sectional view of the FIG. 17 structure following patterning of contact trenches to the top electrode layers, according to an embodiment of the invention.

FIG. 18 shows a cross-sectional view 1800 of the FIG. 17 structure, following patterning of contact trenches 127 in an additional ILD layer 128 formed over the ILD layer 126 and the top electrodes 124. The contact trenches 127 may be patterned using any suitable processing, such as lithographic processing. The contact trenches 127 are aligned with the underlying top electrodes 124, and may have respective widths or horizontal thicknesses (in direction X-X') that are greater than the widths of the top electrodes 124, and may be in the range of 14 nm to 200 nm. The height or vertical thickness (in direction Y-Y') of the contact trenches 127 matches that of the ILD layer 128, and may be in the range of 10 nm to 300 nm.

Figure 19:
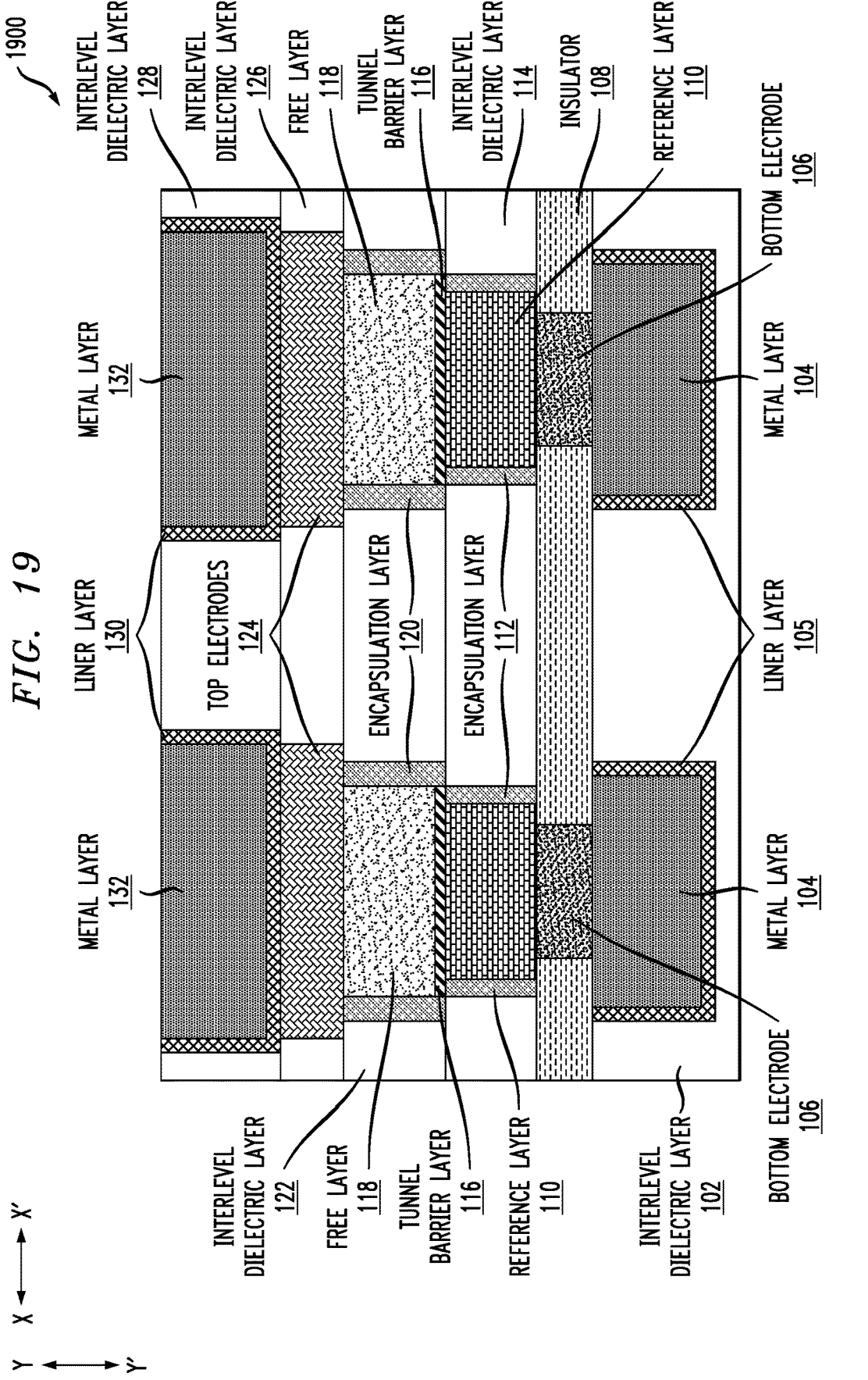
FIG. 19 depicts a side cross-sectional view of the FIG. 18 structure following formation of contacts in the contact trenches, according to an embodiment of the invention.

FIG. 19 shows a cross-sectional view 1900 of the FIG. 18 structure, following formation of liner layers 130 and metal layers 132 in the contact trenches. The liner layers 130 and metal layers 132 may be formed using any suitable deposition processes, and may be formed of materials similar to those of the metal layers 104 and liner layers 105, respectively. The liner layers 130 may have a uniform thickness similar in size to that of the liner layers 105, and the metal layer 132 fills remaining space in the contact trenches after the liner layers 130 are formed.

Figure 20:
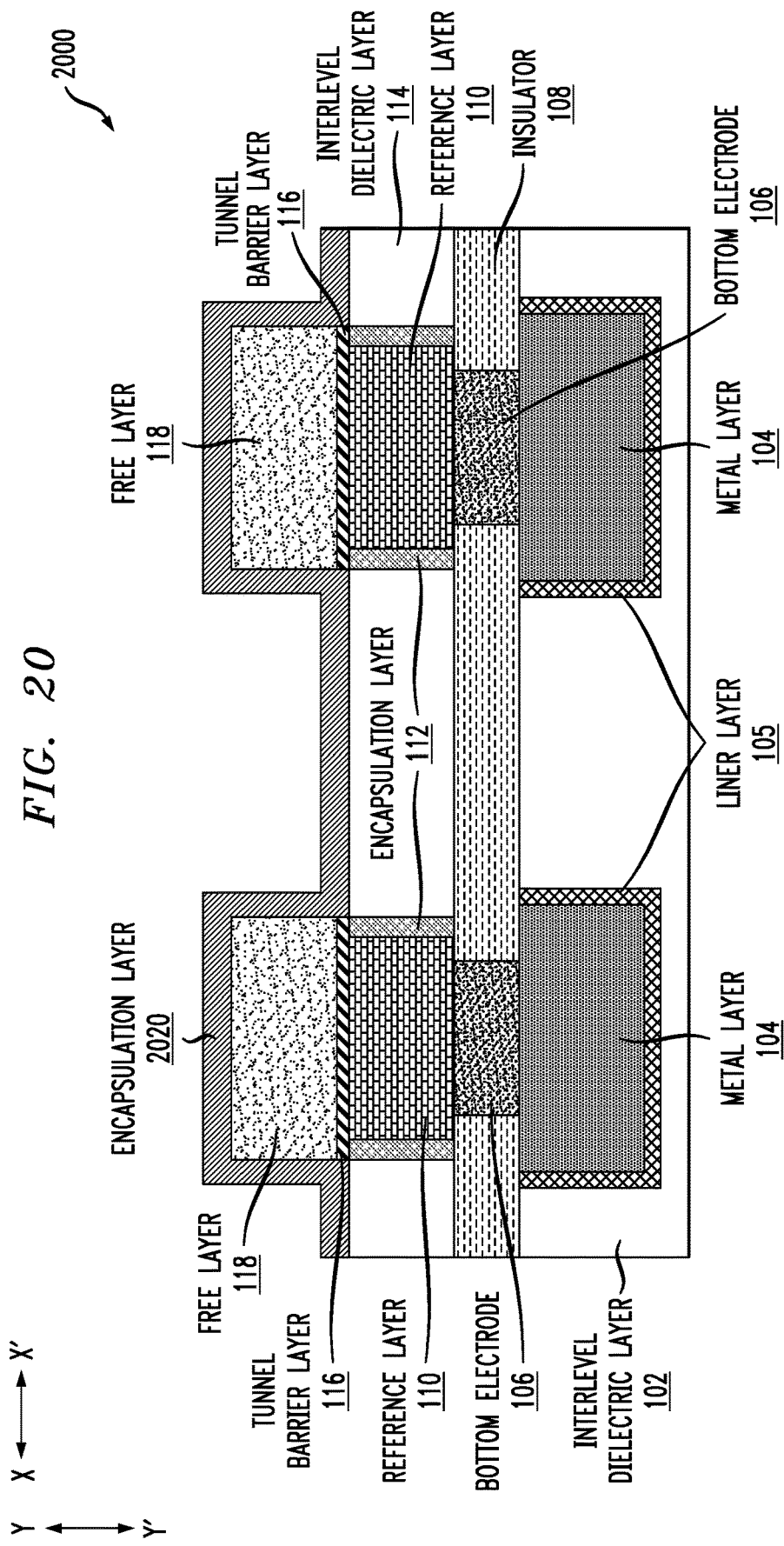
FIG. 20 depicts a side cross-sectional view of the FIG. 9 structure, following formation of another encapsulation layer surrounding the tunnel barrier layer and the free layer of, the other encapsulation layer having a different material than the encapsulation layer surrounding the reference layer, according to an embodiment of the invention.
Figure 21:
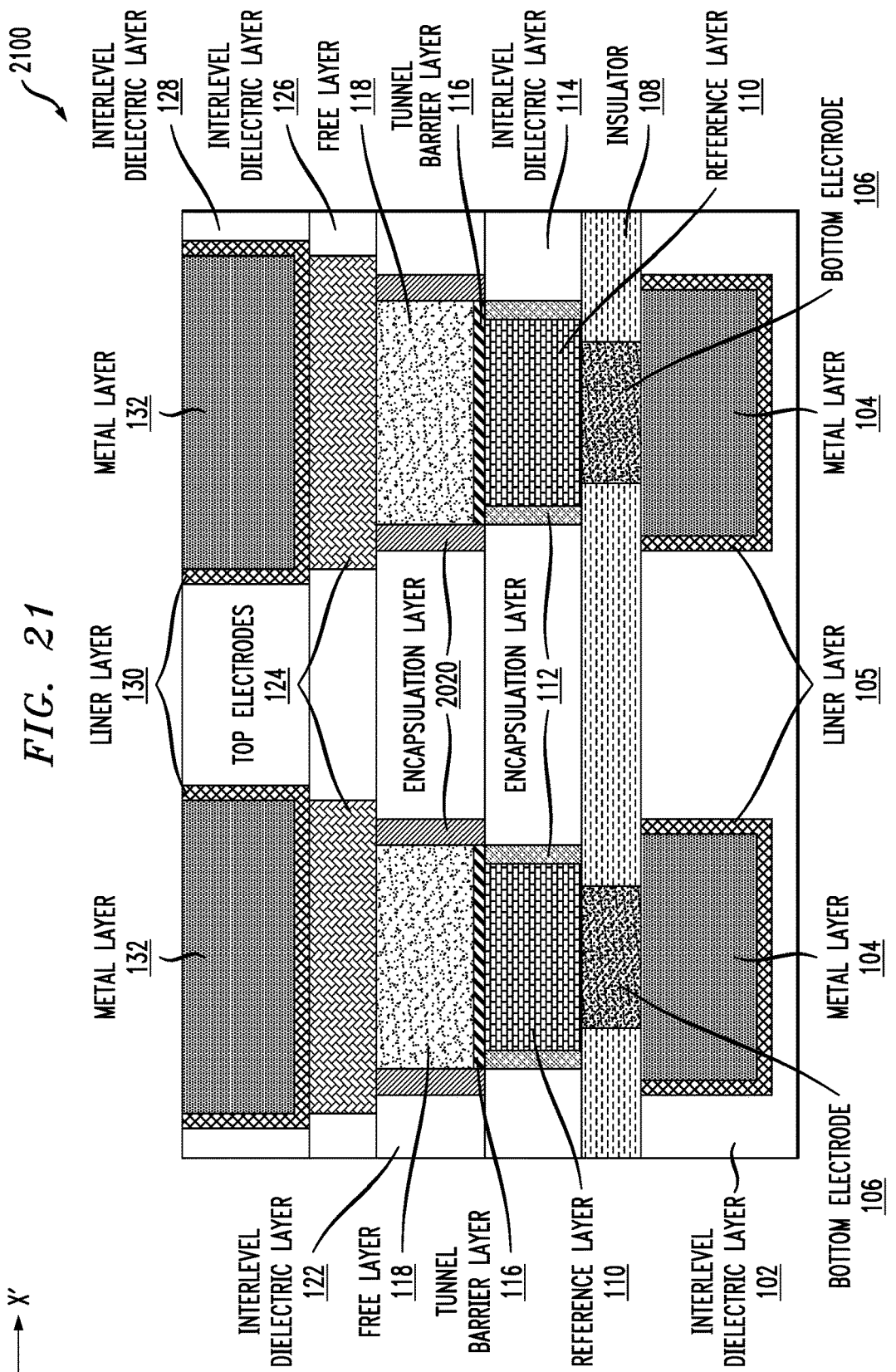
FIG. 21 depicts a side cross-sectional view of the FIG. 20 structure, following patterning of the other encapsulation layer, formation and patterning of top electrode layers, and formation of contacts in contact trenches, according to an embodiment of the invention.

While in the structures shown and described above with respect to FIGS. 1-19, the encapsulation layers 112 and 120 are formed of a same dielectric material, this is not a requirement. Whereas conventional MRAM structures typically require the use of the same encapsulation material for the free layer and the reference layer (e.g., due to the free layer and the reference layer being patterned at the same time followed by a relatively high aspect ratio ILD fill), because illustrative embodiments use multiple ILD formation steps including different ILD formation steps for the reference layers 110 relative to the tunnel barrier layers 116 and the free layers 118, it is possible to form the dielectric encapsulation layer surrounding the reference layers 110 with a different material than the dielectric encapsulation layer surrounding the tunnel barrier layers 116 and the free layers 118. FIG. 20 illustrates such an embodiment, showing a cross-sectional view 2000 of the FIG. 9 structure, where an encapsulation layer 2020 surrounding the tunnel barrier layers 116 and the free layers 118 is formed with a different material than that used for the encapsulation layer 112. For example, the encapsulation layer 2020 may be formed of SiCN and the encapsulation layer 112 is formed of SiN. FIG. 21 shows a cross-sectional view 2100 of the FIG. 20 structure, following processing similar to that described above with respect to FIGS. 11-19 (e.g., etch-back of the encapsulation layer 2020, formation and overburden removal of the ILD layer 122, formation and patterning of the top electrodes 124, formation and overburden removal of the ILD layer 126, and formation of contacts including the liner layer 130 and the metal layer 132 in contact trenches of the additional ILD layer 128).

In some embodiments, ILD nucleation layers are used to improve ILD-to-ILD adhesion of the multiple ILD layers formed using different processing steps (e.g., the ILD layers 114, 122 and 126 formed in three distinct processing steps). FIGS. 22-25 illustrate such an embodiment.

Figure 22:
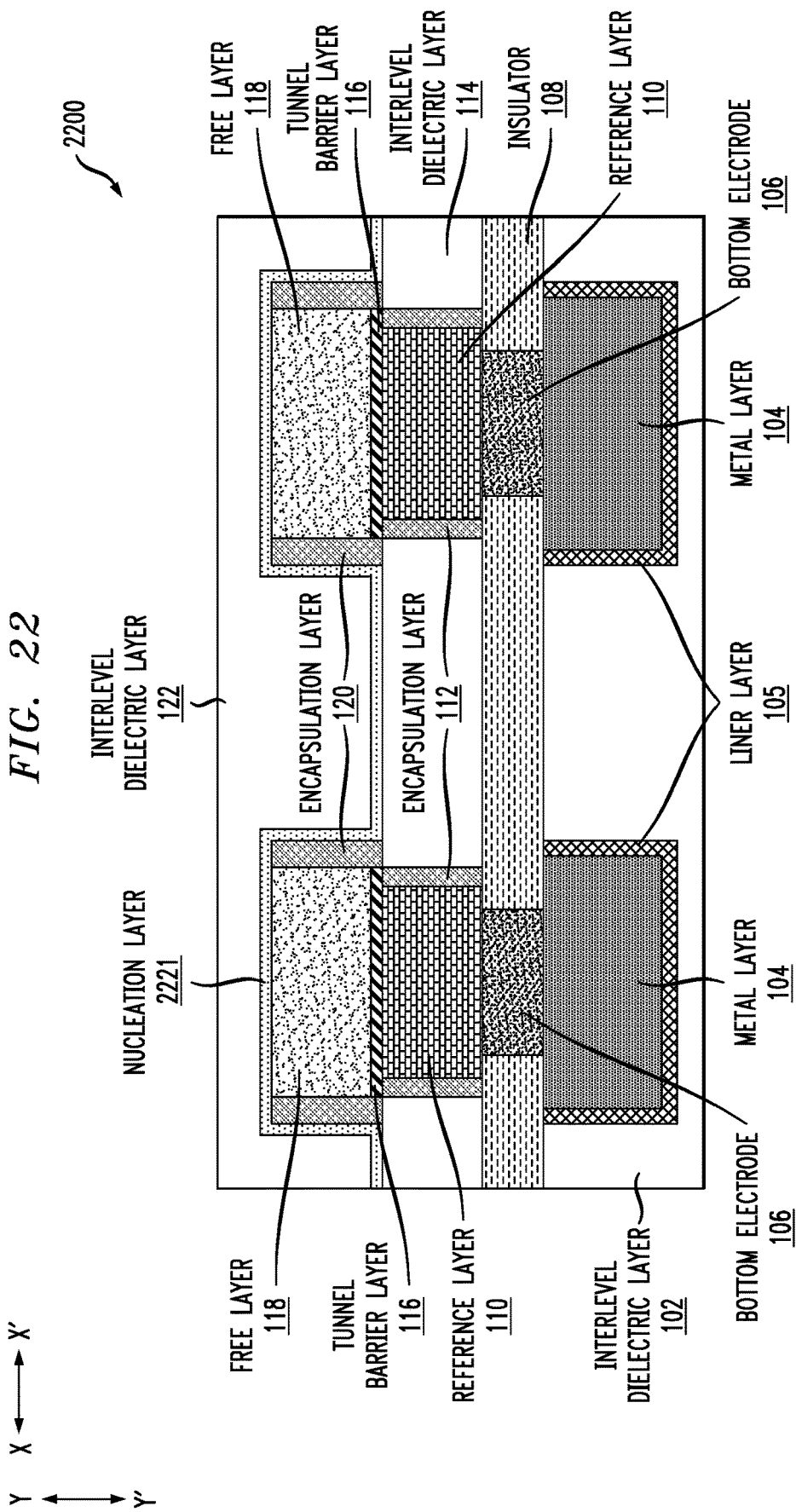
FIG. 22 depicts a side cross-sectional view of the FIG. 12 structure, following formation of a nucleation layer and another ILD layer, according to an embodiment of the invention.

FIG. 22 shows a cross-sectional view 2200 of the FIG. 21 structure, following formation of a nucleation layer 2221 prior to deposition of the ILD layer 122. The nucleation layer 2221 may be formed of SiOC, SiN, SiNC or another suitable material. The nucleation layer 2221 may have a uniform thickness in the range of 1 nm to 5 nm. The nucleation layer 2221 advantageously improves adhesion between the ILD layer 114 and the ILD layer 122. In subsequent overburden removal of the ILD layer 122, portions of the nucleation layer 2221 formed over the top surfaces of the free layers 118 and the encapsulation layer 120 are also removed.

Figure 23:
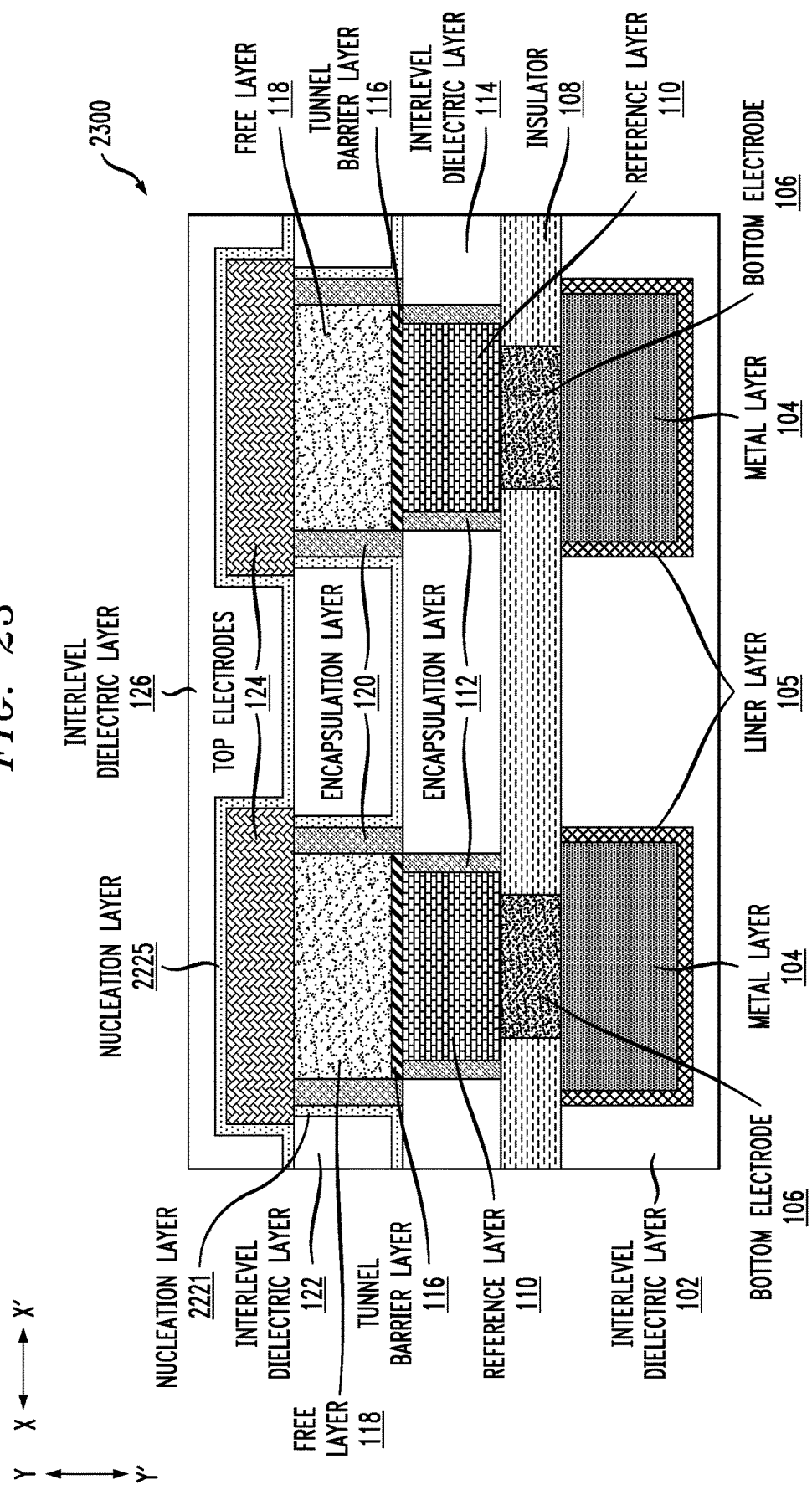
FIG. 23 depicts a side cross-sectional view of the FIG. 22, following overburden removal of the nucleation layer and the ILD layer, and following formation and patterning of the top electrode layers and formation of another nucleation layer and another ILD layer, according to an embodiment of the invention.

FIG. 23 shows a cross-sectional view 2300 of the FIG. 22 structure, following processing similar to that described above with respect to FIGS. 13-15 (e.g., overburden removal of the ILD layer 122 which in this case will also remove portions of the nucleation layer 2221 formed over the top surfaces of the free layer 118 and the encapsulation layer 120, formation and patterning of the top electrodes 124), and following formation of another nucleation layer 2225 prior to formation of ILD layer 126. The nucleation layer 2225 may be formed of similar materials, and with similar sizing and processing as that described above with respect to nucleation layer 2221. The nucleation layer 2225 provides improved adhesion between the ILD layer 126 and the ILD layer 122.

Figure 24:
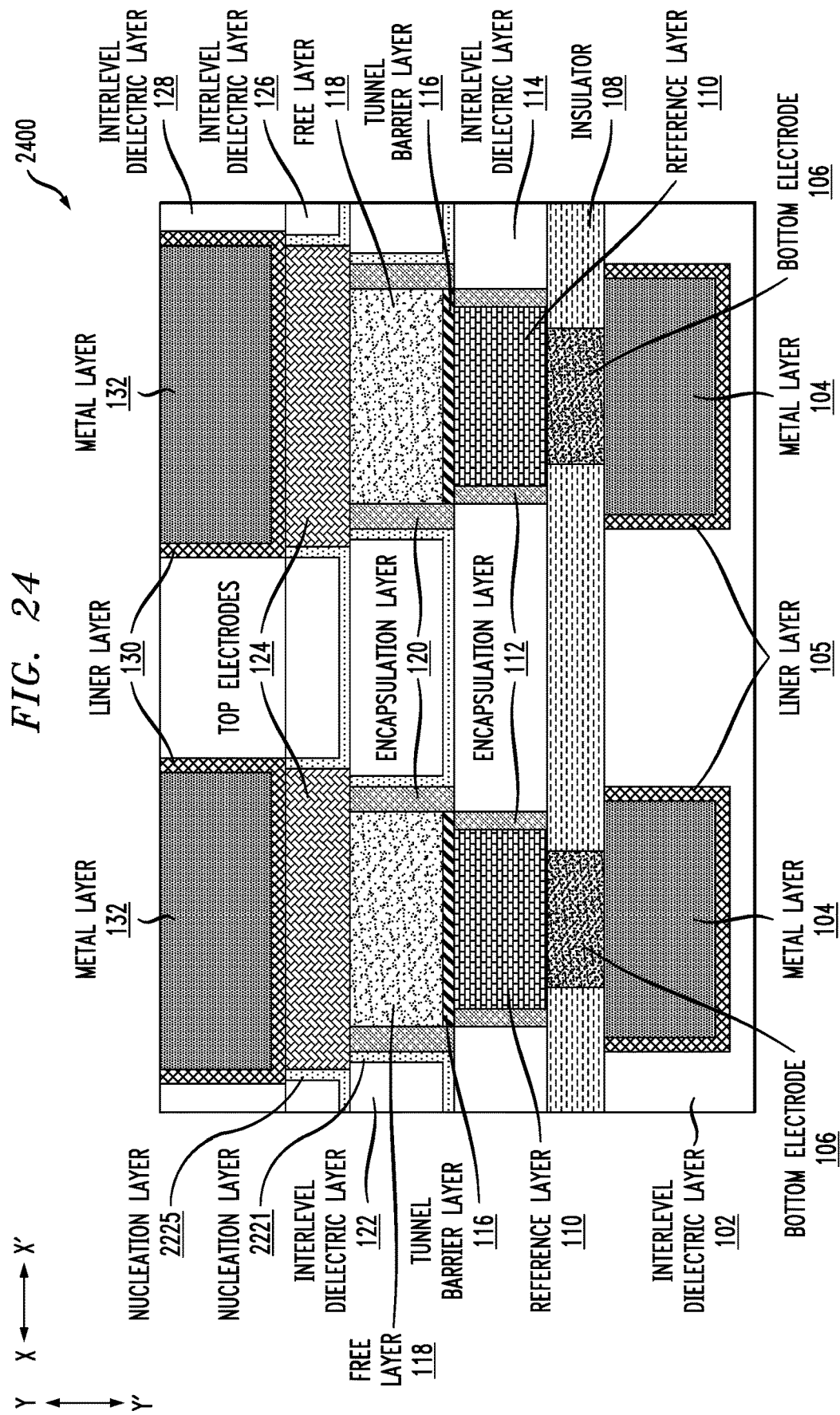
FIG. 24 depicts a side cross-sectional view of the FIG. 23 structure following overburden removal and formation of contacts in contact trenches, according to an embodiment of the invention.

FIG. 24 shows a cross-sectional view 2400 of the FIG. 23 structure, following processing similar to that described above with respect to FIGS. 17-19 (e.g., overburden removal of the ILD layer 126 which in this case will also remove portions of the nucleation layer 2225 formed over the top surfaces of the top electrodes 124, and formation of contacts including liner layer 130 and metal layer 132 in contact trenches of an additional ILD layer 128).

Although FIGS. 22-24 illustrate an embodiment where ILD nucleation layers are formed at both the interface of the ILD layer 114 and the ILD layer 122 (e.g., nucleation layer 2221) and the interface of the ILD layer 122 and the ILD layer 126 (e.g., nucleation layer 2225), this is not a requirement. In other embodiments, an ILD nucleation layer may be formed at only one of such ILD interfaces rather than both. Further, an additional ILD nucleation layer (not shown) may be formed at the interface of the ILD layer 126 and the ILD layer 128 if desired.

Figure 25:
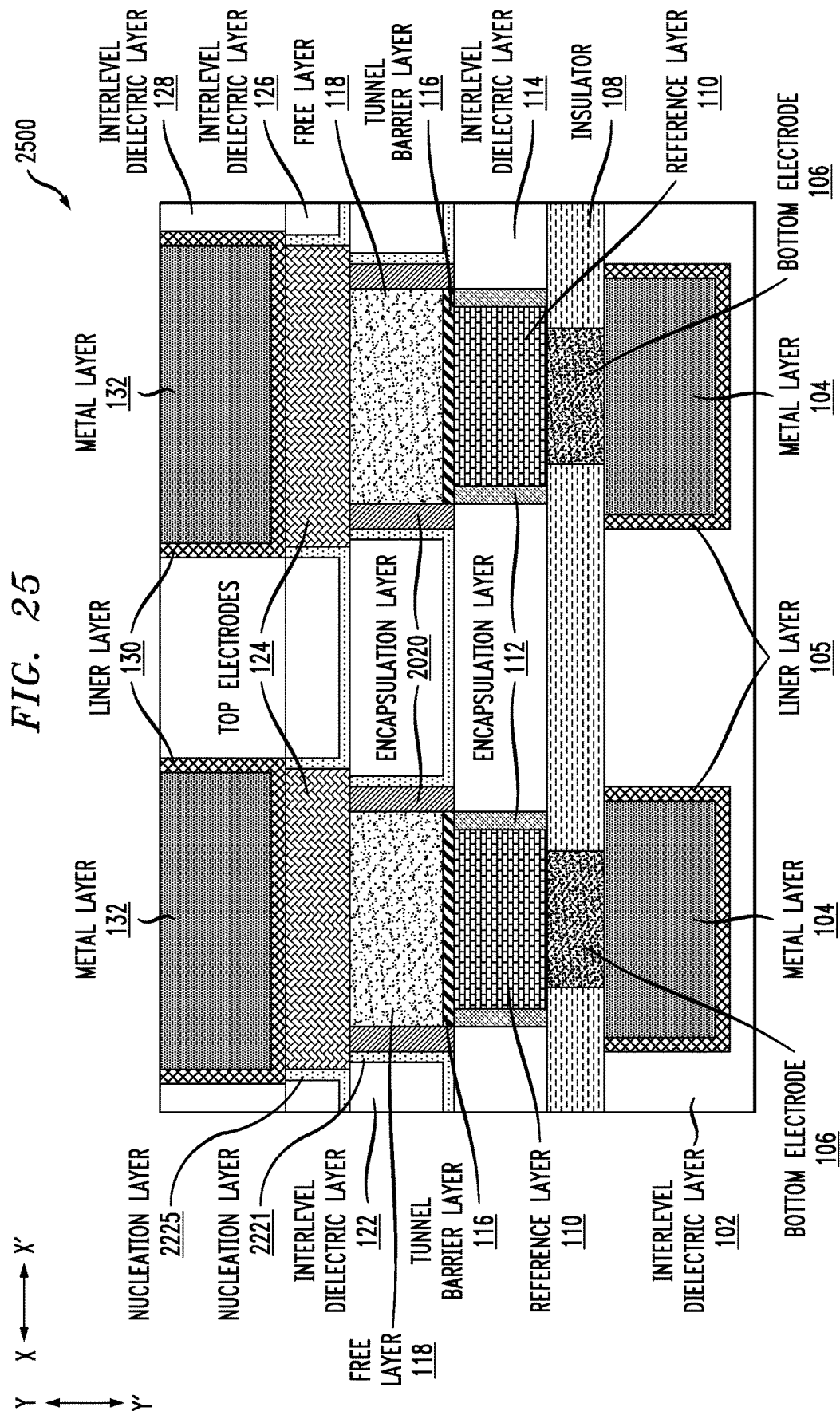
FIG. 25 depicts a semiconductor structure utilizing nucleation layers at ILD layer interfaces and with different encapsulation materials used in encapsulation layers surrounding the free layer and the reference layer of MRAM structures, according to an embodiment of the invention.

FIG. 25 shows a cross-sectional view of a semiconductor structure including MRAM pillars which combines the features of the processing of FIGS. 20-21 and FIGS. 22-24 (e.g., the use of different dielectric encapsulation layers for the reference layer 110 and the tunnel barrier layer 116/free layer 118, and the use of ILD nucleation layers 2221 and 2225 at the ILD interfaces of ILD layers 114, 122 and 126).

As discussed above, and as exemplified in FIGS. 26-28, conventional approaches for forming MRAM pillars may involve high aspect ratio ILD fills which are at risk of forming voids in regions between the MRAM pillars that can lead to shorts. FIG. 26, for example, shows a semiconductor structure that similarly includes ILD layer 102, metal layers 104, liner layers 105, bottom electrodes 106, and insulator layer 108. The FIG. 26 structure includes portions of MRAM pillars such as reference layers 2610, tunnel barrier layers 2616, free layers 2618, top electrodes 2624 and encapsulation layer 2612 that are formed and patterned in same step (e.g., such that the reference layers 2610, the tunnel barrier layers 2616, the free layers 2618 and the top electrodes 2624 have the same diameter (e.g., width or thickness in direction X-X'), and where the same encapsulation layer 2612 surrounds the reference layers 2610, the tunnel barrier layers 2616, the free layers 2618 and the top electrodes 2624. A single ILD layer 2614 is filled between these MRAM pillars, which leads to an area 2601 with a risk of voids during the relatively high aspect ratio ILD fill processing. FIG. 27 illustrates such a void 2603 resulting from the high aspect ratio fill of the ILD layer 2614, and FIG. 28 illustrates a void-induced short 2605 that occurs when material of the liner layers 2630 and metal layers 2632 (in contact trenches above the top electrodes 2624) results in shorting between the MRAM pillars.

Using the techniques described herein provides a number of advantages, including extending the scalability of MRAM memory elements due to void-free ILD gap fill between MRAM pillars and improving embedded MRAM performance due to reduced top contact shorts. Multidisc MRAM pillar structures are provided, where low aspect ratio features are formed prior to each ILD deposition to enable void-free ILD fill and prevent shorting between MTJ top contacts. In addition, the techniques described herein advantageously do not require increasing the top via height (e.g., essentially just moving any voids "higher" to not fill voids with top contact material). Illustrative embodiments provide MRAM pillar structure having a multidisc shape (e.g., where different layers of the MRAM pillars have different diameters) for improved ILD gap fill. More particularly, in some embodiments the diameter of the top electrodes in the MRAM pillars is greater than the diameter of the free layers (and the tunnel barrier layers) in the MRAM pillars, and the diameter of the free layers (and the tunnel barrier layers) in the MRAM pillars is greater than the diameter of the reference layers in the MRAM pillars. Further, the processing described herein enables the use of different encapsulation materials for the reference layers and the free layers (and the tunnel barrier layers), or the same encapsulation material for the reference layers and the free layers (and the tunnel barrier layers) of the MRAM pillars if desired. In addition, ILD nucleation layers may be used to improve ILD-to-ILD adhesion for ILD layers surrounding the MRAM pillars.

An illustrative process flow for formation of MRAM pillar structure includes: reference layer deposition on a bottom electrode; patterning, encapsulation and etch-back of the reference layer; a first ILD deposition followed by overburden removal; free layer deposition; patterning, encapsulation and etch-back of the free layer; a second ILD deposition followed by overburden removal; top electrode layer deposition; patterning, encapsulation and etch-back of the top electrode layer; a third ILD deposition followed by overburden removal; and top contact metal formation.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 29:
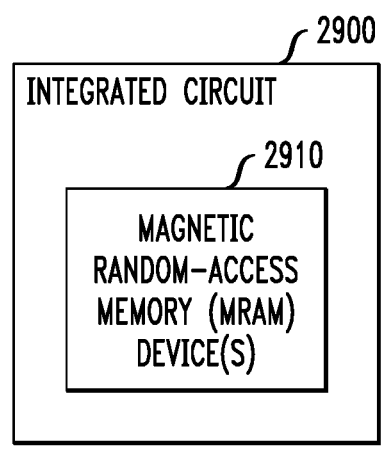
FIG. 29 depicts an integrated circuit comprising one or more MRAM structures with a multidisc shape, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 29 shows an example integrated circuit 2900 which includes one or more MRAM structures 910, where at least one of the MRAM structures comprises a multidisc pillar structure as described elsewhere herein (e.g., such as the structures shown in FIGS. 19, 21, 24 and 25).

In some embodiments, a semiconductor structure comprises a reference layer of an MRAM pillar structure, the reference layer having a first diameter, a free layer of the MRAM pillar structure disposed over the reference layer, the free layer having a second diameter, and an electrode layer (e.g., for a top electrode) of the MRAM pillar structure disposed over the free layer, the electrode layer having a third diameter. At least two of the first diameter, the second diameter and the third diameter are different.

The third diameter may be greater than the second diameter, and the second diameter may be greater than the first diameter.

The semiconductor structure may further comprise a tunnel barrier layer of the MRAM pillar structure disposed between the reference layer and the free layer, the tunnel barrier layer having the second diameter.

The semiconductor structure may further comprise a first encapsulation layer surrounding sidewalls of the reference layer and a second encapsulation layer surrounding sidewalls of the free layer. The first encapsulation layer and the second encapsulation layer may be a same material, or the first encapsulation layer may comprise a first dielectric material and the second encapsulation layer may comprise a second dielectric material different than the first dielectric material. The first dielectric material may comprise SiN and the second dielectric material may comprise SiCN.

The semiconductor structure may further comprise a first ILD layer surrounding the reference layer and a second ILD layer surrounding the free layer. The semiconductor structure may further comprise an ILD nucleation layer disposed between the first ILD layer and the second ILD layer. The first ILD layer and the second ILD layer may comprise at least one of SiCOH, SiCNO and SiCHNO, and the ILD nucleation layer may comprise at least one of SiOC, SiN and SiCN. The semiconductor structure may further comprise a third ILD layer surrounding sidewalls of the electrode layer and another ILD nucleation layer disposed between the second ILD layer and the third ILD layer.

In some embodiments, an integrated circuit comprises one or more MRAM devices. At least one of the one or more MRAM devices comprises an MRAM pillar comprising a reference layer having a first diameter, a free layer having a second diameter disposed over the reference layer, and an electrode layer (e.g., for a top electrode) having a third diameter disposed over the free layer. At least two of the first diameter, the second diameter and the third diameter are different.

The third diameter may be greater than the second diameter, and the second diameter may be greater than the first diameter.

The integrated circuit may further comprise a first encapsulation layer surrounding sidewalls of the reference layer and a second encapsulation layer surrounding sidewalls of the free layer, wherein the first encapsulation layer comprises a first dielectric material and the second encapsulation layer comprises a second dielectric material different than the first dielectric material.

The integrated circuit may further comprise a first ILD layer surrounding the reference layer, a second ILD layer surrounding the free layer, a third ILD layer surrounding the electrode layer, a first ILD nucleation layer disposed between the first ILD layer and the second ILD layer, and a second ILD nucleation layer disposed between the second ILD layer and the third ILD layer.

In some embodiments, a method comprises forming a reference layer of an MRAM pillar structure, the reference layer having a first diameter, forming a free layer of the MRAM pillar structure over the reference layer, the free layer having a second diameter, and forming an electrode layer of the MRAM pillar structure over the free layer, the electrode layer having a third diameter. At least two of the first diameter, the second diameter and the third diameter are different.

The third diameter may be greater than the second diameter, and the second diameter may be greater than the first diameter.

The method may further comprise forming a first encapsulation layer on sidewalls of the reference layer, forming a first ILD layer surrounding the first encapsulation layer, forming a second encapsulation layer on sidewalls of the free layer, forming a second ILD layer surrounding the second encapsulation layer, and forming a third ILD layer surrounding the electrode layer. The first encapsulation layer may comprise a first dielectric material and the second encapsulation layer may comprise a second dielectric material different than the first dielectric material. The method may further comprise forming a first ILD nucleation layer between the first ILD layer and the second ILD layer, and forming a second ILD nucleation layer between the second ILD layer and the third ILD layer.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a reference layer of a magnetic random-access memory pillar structure, the reference layer having a first diameter;
   a free layer of the magnetic random-access memory pillar structure disposed over the reference layer, the free layer having a second diameter; and
   an electrode layer of the magnetic random-access memory pillar structure disposed over the free layer, the electrode layer having a third diameter;
   wherein at least one of: the first diameter is less than the second diameter; and
   the second diameter is less than the third diameter.

2. The semiconductor structure of claim 1, wherein the third diameter is greater than the second diameter, and wherein the second diameter is greater than the first diameter.

3. The semiconductor structure of claim 1, further comprising a tunnel barrier layer of the magnetic random-access memory pillar structure disposed between the reference layer and the free layer, the tunnel barrier layer having the second diameter.

4. The semiconductor structure of claim 1, further comprising a first encapsulation layer surrounding sidewalls of the reference layer and a second encapsulation layer surrounding sidewalls of the free layer.

5. The semiconductor structure of claim 4, wherein the first encapsulation layer and the second encapsulation layer are a same material.

6. The semiconductor structure of claim 4, wherein the first encapsulation layer comprises a first dielectric material and the second encapsulation layer comprises a second dielectric material different than the first dielectric material.

7. The semiconductor structure of claim 6, wherein the first dielectric material comprises silicon nitride (SiN) and the second dielectric material comprises silicon carbonitride (SiCN).

8. The semiconductor structure of claim 1, further comprising a first interlevel dielectric layer surrounding the reference layer and a second interlevel dielectric layer surrounding the free layer.

9. The semiconductor structure of claim 8, further comprising a third interlevel dielectric layer surrounding sidewalls of the electrode layer and another interlevel dielectric nucleation layer disposed between the second interlevel dielectric layer and the third interlevel dielectric layer.

10. A semiconductor structure comprising:
    a reference layer of a magnetic random-access memory pillar structure, the reference layer having a first diameter;
    a free layer of the magnetic random-access memory pillar structure disposed over the reference layer, the free layer having a second diameter;
    an electrode layer of the magnetic random-access memory pillar structure disposed over the free layer, the electrode layer having a third diameter;
    a first interlevel dielectric layer surrounding the reference layer;
    a second interlevel dielectric layer surrounding the free layer; and
    an interlevel dielectric nucleation layer disposed between the first interlevel dielectric layer and the second interlevel dielectric layer;
    wherein at least two of the first diameter, the second diameter and the third diameter are different.

11. The semiconductor structure of claim 10, wherein:
    the first interlevel dielectric layer and the second interlevel dielectric layer comprises at least one of: a dielectric including silicon, carbon, oxygen and hydrogen (SiCOH); a dielectric including silicon, carbon, nitrogen and oxygen (SiCNO); and a dielectric including silicon, carbon, hydrogen, nitrogen and oxygen (SiCHNO); and the interlevel dielectric nucleation layer comprises at least one of silicon oxycarbide (SiOC), silicon nitride (SiN) and silicon carbonitride (SiCN).

12. An integrated circuit, comprising:
one or more magnetic random-access memory devices, at least one of the one or more magnetic random-access memory devices comprising a magnetic random-access memory pillar comprising:
a reference layer having a first diameter;
a free layer having a second diameter disposed over the reference layer; and
an electrode layer having a third diameter disposed over the free layer;
wherein at least one of: the first diameter is less than the second diameter; and
the second diameter is less than the third diameter.

13. The integrated circuit of claim 12, wherein the third diameter is greater than the second diameter, and wherein the second diameter is greater than the first diameter.

14. The integrated circuit of claim 12, further comprising a first encapsulation layer surrounding sidewalls of the reference layer and a second encapsulation layer surrounding sidewalls of the free layer, wherein the first encapsulation layer comprises a first dielectric material and the second encapsulation layer comprises a second dielectric material different than the first dielectric material.

15. The integrated circuit of claim 12, further comprising a first interlevel dielectric layer surrounding the reference layer, a second interlevel dielectric layer surrounding the free layer, a third interlevel dielectric layer surrounding the electrode layer, a first interlevel dielectric nucleation layer disposed between the first interlevel dielectric layer and the second interlevel dielectric layer, and a second interlevel dielectric nucleation layer disposed between the second interlevel dielectric layer and the third interlevel dielectric layer.

16. The integrated circuit of claim 12, further comprising a tunnel barrier layer of the magnetic random-access memory pillar structure disposed between the reference layer and the free layer, the tunnel barrier layer having the second diameter.

17. The integrated circuit of claim 12, further comprising a first encapsulation layer surrounding sidewalls of the reference layer and a second encapsulation layer surrounding sidewalls of the free layer.

18. The integrated circuit of claim 17, wherein the first encapsulation layer and the second encapsulation layer are a same material.

19. The integrated circuit of claim 12, further comprising a first interlevel dielectric layer surrounding the reference layer and a second interlevel dielectric layer surrounding the free layer.

20. The integrated circuit of claim 19, further comprising an interlevel dielectric nucleation layer disposed between the first interlevel dielectric layer and the second interlevel dielectric layer.

* * * * *